United States Patent
Futatsuya et al.

(10) Patent No.: US 7,926,003 B2
(45) Date of Patent: Apr. 12, 2011

(54) METHOD FOR MANUFACTURING A PHOTOMASK

(75) Inventors: Hiroki Futatsuya, Akishima (JP); Kazumasa Morishita, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 118 days.

(21) Appl. No.: 12/481,226

(22) Filed: Jun. 9, 2009

(65) Prior Publication Data

US 2009/0293039 A1    Nov. 26, 2009

Related U.S. Application Data

(62) Division of application No. 11/209,748, filed on Aug. 24, 2005, now Pat. No. 7,562,334.

(30) Foreign Application Priority Data

Mar. 30, 2005   (JP) .................. 2005-099245

(51) Int. Cl.
G06F 17/50 (2006.01)
G03F 1/00 (2006.01)

(52) U.S. Cl. .................. 716/50; 716/54; 430/5

(58) Field of Classification Search .......... 716/50, 716/54; 430/5

See application file for complete search history.

(56) References Cited

U.S. PATENT DOCUMENTS

| | | |
|---|---|---|
| 5,046,012 A | 9/1991 | Morishita et al. |
| 6,077,310 A | 6/2000 | Yamamoto et al. |
| 7,120,882 B2 | 10/2006 | Kotani et al. |
| 7,155,698 B1 | 12/2006 | Gennari |
| 7,509,622 B2 * | 3/2009 | Sinha et al. .............. 716/50 |
| 2006/0190850 A1 | 8/2006 | Kohle et al. |
| 2006/0195808 A1 | 8/2006 | Keck |
| 2006/0277520 A1 | 12/2006 | Gennari |
| 2007/0006116 A1 | 1/2007 | Percin et al. |

FOREIGN PATENT DOCUMENTS

| | | |
|---|---|---|
| CN | 18228614 A1 | 9/2006 |
| JP | 2001-013669 A | 1/2001 |

OTHER PUBLICATIONS

Chinese Office Action dated Nov. 16, 2007 issued in corresponding application No. 200510108434.4.

* cited by examiner

*Primary Examiner* — Stacy A Whitmore
(74) *Attorney, Agent, or Firm* — Westerman, Hattori, Daniels & Adrian, LLP

(57) ABSTRACT

A method for manufacturing a photomask based on design data includes the steps of forming a figure element group including a figure element in a layout pattern on the photomask and a figure element affecting the figure element due to the optical proximity effect, adding identical identification data to a data group indicating an identical figure element group, estimating an influence of the optical proximity effect on the figure element group, generating correction data indicating a corrected figure element in which the influence of the optical proximity effect is compensated for at the time of exposure, creating figure data by associating data having the identical identification data with correction data having the identical identification data, and forming a mask pattern on the photomask using figure data. Thus, the computation time for correction of the layout can be reduced, thereby reducing the production time of the photomask.

3 Claims, 18 Drawing Sheets

170

171
172
173

174 S(x1,Y1)
E(x2,Y2)
Size of the side

175 Additional information
a:the figure type to which the side belongs
b:the amount of correction for the side
c:a flag indicating whether or not the side is to be corrected
d:inclusion relationship
e:a flag indicating the occurrence of an error during the process
f:other data 176 Identification data

METHOD FOR MANUFACTURING A PHOTOMASK

CROSS-REFERENCE TO RELATED APPLICATIONS

The present application is a division of U.S. application Ser. No. 11/209,748, filed Aug. 24, 2005, which is based upon and claims the benefit of priority from the prior Japanese Patent Application No. 2005-099245, filed on Mar. 30, 2005, the entire contents of which are incorporated herein by reference.

BACKGROUND OF THE INVENTION

1. Field of the Invention

The present invention relates to a method for manufacturing a photomask, suitable for reducing the production time, and to a method for manufacturing a semiconductor device using the photomask. More specifically, the present invention relates to a method for manufacturing a photomask in which data for forming a pattern on the photomask can be created in a short time, and to a method for manufacturing a semiconductor device using the photomask.

2. Description of the Related Art

With the recent reduction in size of semiconductor devices, there has been a demand for miniaturization of resist patterns formed by photolithography for manufacturing semiconductor devices. When light is applied to a photomask and the resist is exposed with light, a pattern on the photomask is transferred to form a resist pattern. If the pattern size of the resist pattern is close to the wavelength of light used for formation of the resist pattern because miniaturization of resist pattern has advanced, the pattern on the photomask is deformed, while transferred, due to the optical proximity effect.

In order to prevent deformation of the resist pattern, the deformation of the resist pattern due to the optical proximity effect is predicted by simulation, etc., to correct the original pattern on the photomask.

However, such simulation, when performed using a computer, requires much time for computation because of the high pattern density on the photomask. There are many approaches for reducing the computation time to rapidly correct the pattern on the photomask, and one of them is proposed in, for example, Japanese Unexamined Patent Application Publication No. 2001-13669.

In the approach proposed in this publication, regions for correction are provided with respect to an object for correction in the input layout, and pattern-matching regions that are a certain amount larger than the regions for correction are also provided so as to surround the regions for correction. Then, the pattern layout in each of the pattern-matching regions is extracted. Then, the grid in this pattern-matching region is converted into a larger grid than the original grid. Thereafter, pattern matching is performed on a pattern region. As a result of pattern matching, for example, three kinds into which the pattern-matching regions that are classified using the original grid are reduced to two kinds after conversion of the grid.

After pattern matching is performed on all regions for correction, the classified pattern-matching regions are corrected. The corrected pattern-matching regions are reflected in the entirety of the input layout, and the corrected layout is thus obtained.

Therefore, conversion of the grid can reduce the number of kinds of pattern-matching regions. Thus, the computation time for correcting the pattern-matching regions can also be reduced. Moreover, a correction result of a pattern computed for one pattern-matching region can also be used for the same kind of other pattern-matching regions, thus reducing the computation time required for reflecting the corrected pattern-matching regions in the entirety of the input layout.

SUMMARY OF THE INVENTION

It is an object of the present invention to provide a method for manufacturing a photomask in which the time for creating data for forming a pattern on the photomask is reduced to thereby reduce the production time of the photomask, and a method for manufacturing a semiconductor device using the photomask.

With the reduction in size of semiconductor devices, layout patterns are formed with high density on a photomask. Thus, the computation time for correction of the layout increases in order to compensate for an influence of the optical proximity effect. Therefore, a problem occurs in that the time for creating data for a layout pattern on the photomask becomes long and the time for manufacturing the photomask also increases.

Therefore, the present invention aims to provide a method for manufacturing a photomask in which the production time of the photomask can be reduced.

As the layout pattern density on a photomask increases, the number of pattern matching regions also increases. Thus, the computation time for checking the conformity of pattern matching regions by pattern matching increases.

Therefore, the present invention further aims to provide a method for manufacturing a photomask in which the computation time for checking the conformity is reduced, thereby reducing the production time of the photomask.

The present invention further aims to provide a method for manufacturing a photomask in which the production time can be reduced while maintaining a high-accuracy layout pattern, or a high-accuracy resist pattern to be transferred to a semiconductor device, because the computation for correcting the layout is performed without increasing the size of the design grid of the layout pattern on the photomask.

In one aspect of the present invention, a method for manufacturing a photomask includes the steps of extracting data indicating a figure element from design data, and forming a figure element group including this figure element and a figure element affecting the figure element due to the optical proximity effect. The method further includes the steps of adding identification data to a data group indicating the figure element group, and estimating the influence of the optical proximity effect on the figure element group. The method further includes the steps of generating correction data indicating a corrected figure element in which the influence of the optical proximity effect is compensated for, and configuring figure data including the corrected figure element by associating data having identical identification data with the correction data having the identical identification data. The method further includes a step of forming a mask pattern on the photomask using the figure data.

According to the method of the present invention, identification data is assigned to data indicating a figure element group that affects a figure element in a mask figure on a photomask due to the optical proximity effect. Then, data indicating a corrected figure element with respect to data indicating a partial figure element is generated. When the data indicating the corrected figure element in which the optical proximity effect is compensated for is generated, the data indicating the corrected figure element is distributed to data indicating other figure elements having the identical identification data. Thus, a figure element from which the corrected figure element is to be produced can easily be searched for and classified based on the identification data assigned to the data indicating the figure element group, and the time for identifying this figure element can be reduced. Moreover, even if there are many kinds of figure elements from which corrected figure elements are to be produced, photomask layout data can be configured in a short time based on the data indicating the corrected figure element. The production time of the photomask can therefore be reduced.

In another aspect of the present invention, there is provided an apparatus for performing the above-described method for manufacturing a photomask.

In still another aspect of the present invention, there is provided a method for manufacturing a semiconductor device using the photomask manufactured by the method described above.

According to the apparatus of the present invention, the time required for manufacturing a photomask can be reduced.

According to the method for manufacturing a semiconductor device according to the present invention, with the use of a high-accuracy photomask, a semiconductor device with high processing accuracy can be provided.

DESCRIPTION OF THE PREFERRED EMBODIMENTS

First, second, and third embodiments of the present invention will be described hereinbelow.

First Embodiment

A method for manufacturing a photomask according to a first embodiment of the present invention will be described with reference to FIGS. 1 to 11. The term photomask means a sheet, typically, a quartz glass plate, having a metal thin-film pattern formed thereon. Light is applied to the photomask to transfer the metal thin-film pattern on the photomask to a photosensitive film, or a resist, applied to a semiconductor substrate on which a semiconductor device is formed. The materials on the semiconductor substrate are etched using, as a mask, a resist pattern formed by transferring the metal thin-film pattern on the photomask, thereby forming a circuit pattern of the semiconductor device.

Figure 1:
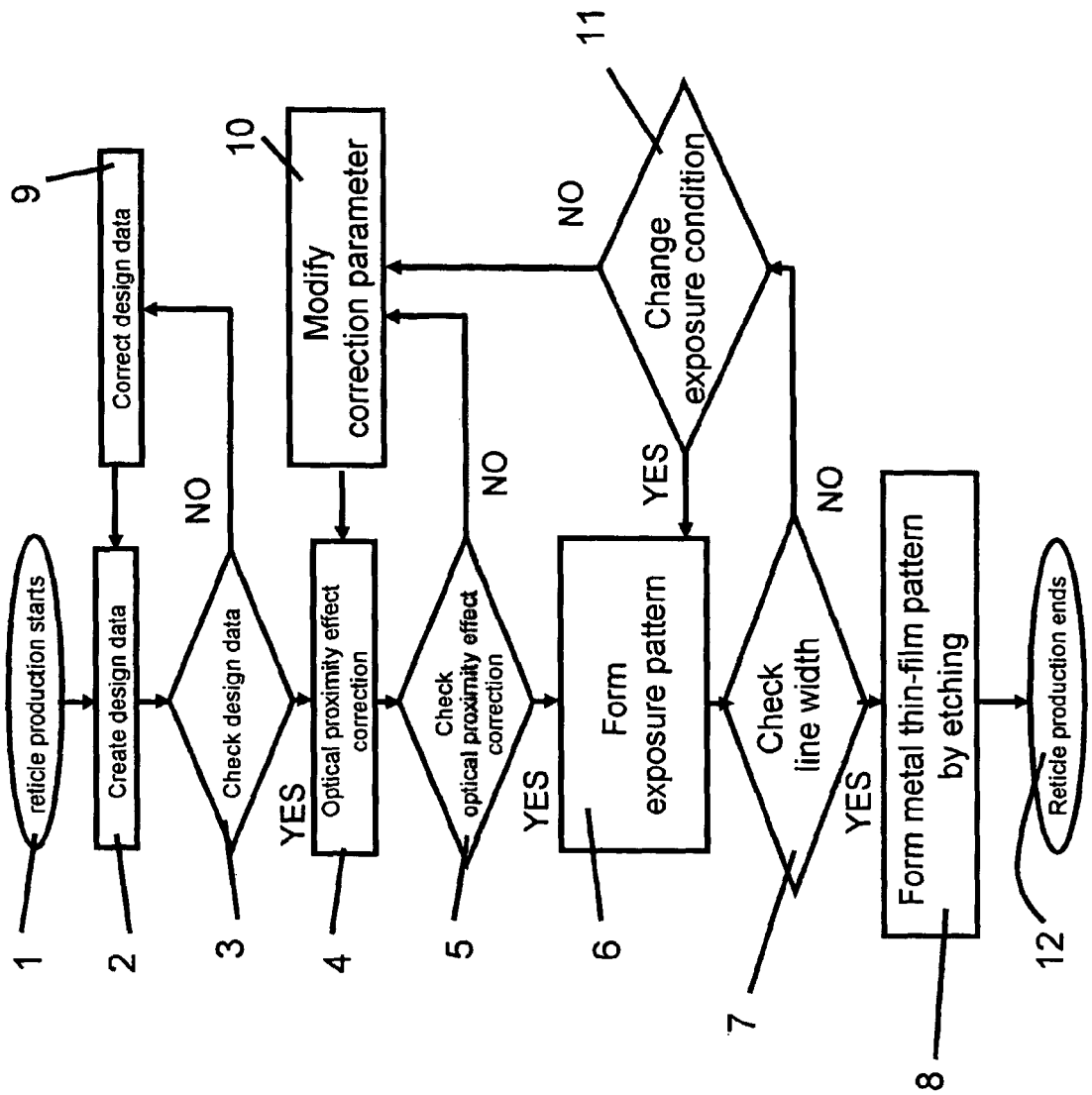
FIG. 1 is a flowchart showing a method for manufacturing a photomask according to a first embodiment of the present invention.

FIG. 1 is a flowchart showing the method for manufacturing a photomask according to the first embodiment. The method shown in FIG. 1 includes step 1: "reticle production starts", step 2: "create design data", step 3: "check design data", step 4: "optical proximity effect correction", step 5: "check optical proximity effect correction", step 6: "form exposure pattern", step 7: "check line width", step 8: "form metal thin-film pattern by etching", step 9: "modify design data", step 10: "modify correction parameter", step 11: "change exposure condition", and step 12: "reticle production ends".

In step 1, reticle production starts. A reticle is typically, a quartz glass plate, having a metal thin-film pattern formed thereon, and is a kind of photomask. Generally, a metal thin-film pattern on a reticle includes patterned parts for circuit patterning of one chip to several chips of a semiconductor device. The reticle is therefore used to transfer the metal thin-film pattern on the reticle to a partial region in a semiconductor substrate on which a semiconductor device is formed.

In step 2, design data used for forming the metal thin-film pattern on the reticle is created.

In step 3, it is determined whether or not the design data is created according to a design rule. The design rule includes limitations in forming the metal thin-film pattern on the reticle. The design rule includes, for example, limitations to ensure the minimum line width and the minimum pattern interval of the metal thin-film pattern and limitations to eliminate an acute-angled pattern. If the design data meets the design rule, the process proceeds to step 4. If the design data does not meet the design rule, the process proceeds to step 9.

In step 9, the design data is corrected for a design data portion which does not meet the design rule to meet the design rule.

The processing of step 4 will be schematically described although the details are described below with reference to FIG. 2. First, light is applied to the reticle to produce a projected image of the metal thin-film pattern on the reticle. The projected image is passed through a lens to produce a miniature projected image. If the size of the metal thin-film pattern on the reticle is close to the wavelength of the light, the so-called optical proximity effect prevents the miniature projected image from being completely similar to the metal thin-film pattern. It is therefore necessary to deform the metal thin-film pattern on the reticle and to correct the design data to form the undeformed metal thin-film pattern so that the miniature projected image is similar to the undeformed metal thin-film pattern. In step 4, therefore, the design data is corrected to generate figure data for forming the deformed metal thin-film pattern on the reticle.

In step 5, it is determined whether or not the corrected design data is suitable to produce the desired miniature projected image. If the corrected design data is suitable, the process proceeds to step 6. If the corrected design data is not suitable, the process proceeds to step 10.

In step 10, the correction parameter for the called optical proximity effect correction is modified.

In step 6, electron-beam emission from a drawing device is operated using the corrected design data, i.e., the figure data, to form a resist pattern on a metal thin-film.

In step 7, the line width of the resist pattern formed in step 6 is checked. If the line width of the resist pattern is within a standard width, the process proceeds to step 8. If the line width of the resist pattern is not within the standard width, the process proceeds to step 11.

In step 11, the exposure conditions of an electron beam from an electron-beam exposure device, i.e., a drawing device are changed so that the line width of the resist pattern formed in step 6 is within the standard width. If it is determined that the line width of the resist pattern cannot be made within the standard width by changing only the exposure conditions of the electron beam, the process proceeds to step 10. Then, the processing of step 4 is performed again.

In step 8, the metal thin-film is etched using the resist pattern formed in step 6 as a mask to form a metal thin-film pattern.

Therefore, the metal thin-film pattern is formed on the quartz glass plate, and, then, reticle production ends in step 12.

Figure 2:
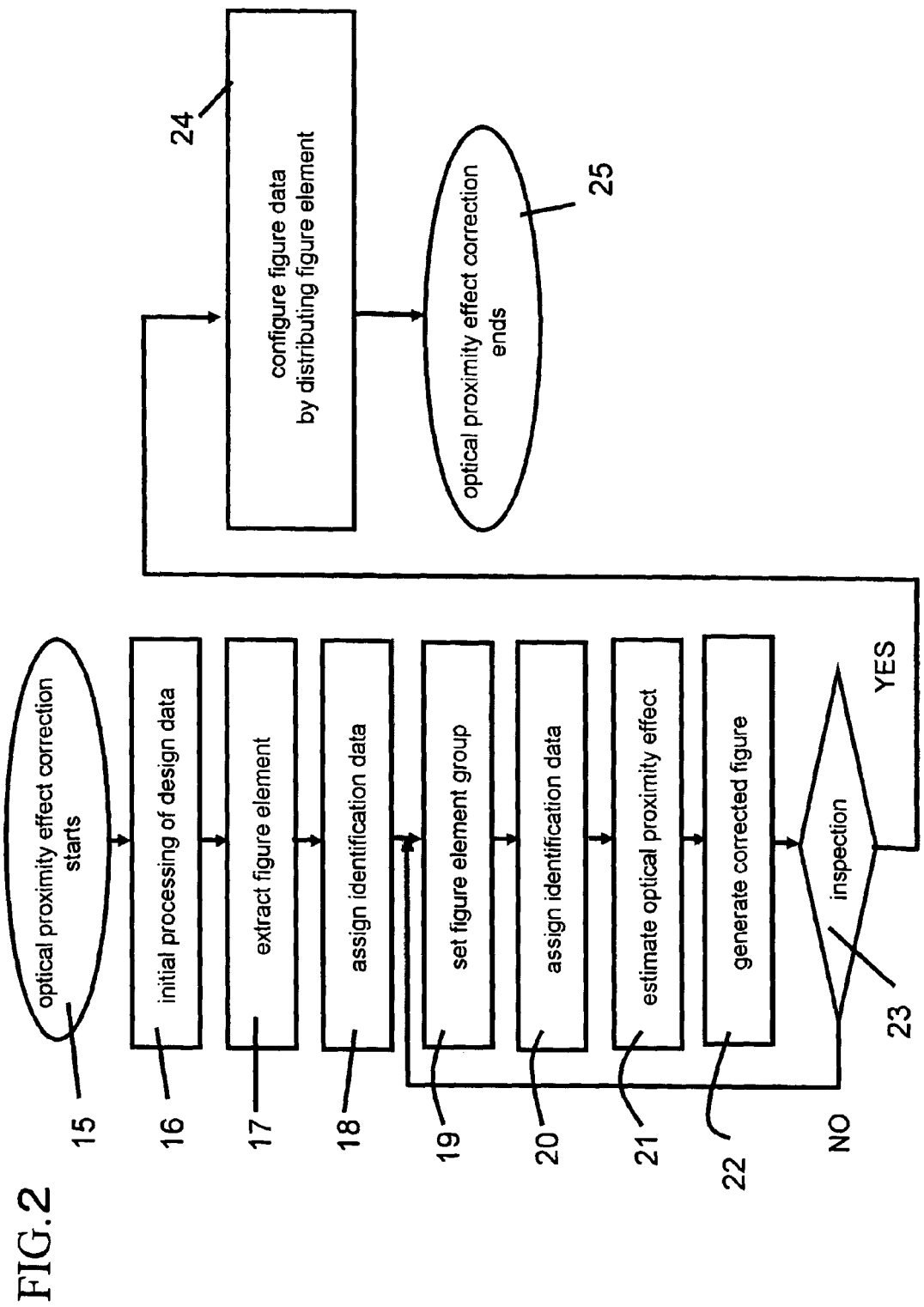
FIG. 2 is a flowchart showing the details of an optical proximity effect correction step in the flowchart shown in FIG. 1.

FIG. 2 is a flowchart showing the details of an optical proximity effect correction process in step 4 in the flowchart shown in FIG. 1. The process shown in FIG. 2 includes step 15: "optical proximity effect correction starts", step 16: "initial processing of design data", step 17: "extract figure element", step 18: "assign identification data", step 19: "set figure element group", step 20: "assign identification data", step 21: "estimate optical proximity effect", step 22: "generate corrected figure", step 23: "inspection", step 24: "configure figure data by distributing figure element", and step 25: "optical proximity effect correction ends".

The optical proximity effect correction process includes the processing of steps 16 to 24, and the processing of steps 16 to 24 will be described with reference to FIGS. 3A to 10.

Figure 3A:
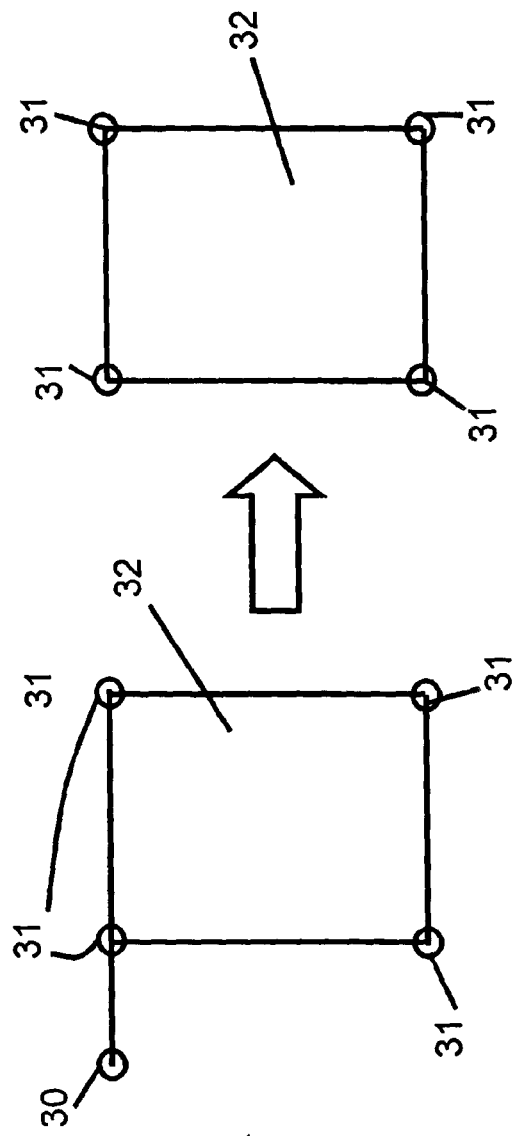
FIGS. 3A and 3B are illustrations showing an initial processing step for design data in the flowchart shown in FIG. 2.
Figure 3B:
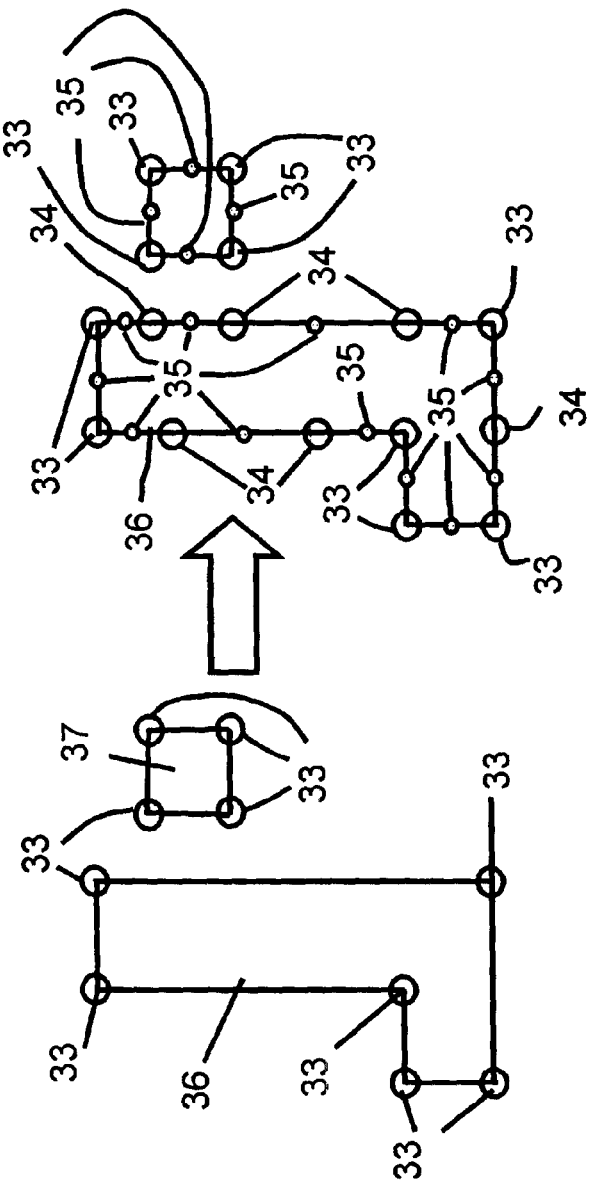

FIGS. 3A and 3B are illustrations showing the processing of step 16 in the flowchart shown in FIG. 2.

In step 16, unnecessary data is removed from the design data, and data indicating evaluation points is added to the design data.

FIG. 3A is an illustration showing the process of removing unnecessary data is removed from the design data.

In FIG. 3A, as indicated in the left portion, data indicating a figure element 32 includes data indicating four vertices 31 and data indicating one vertex 30. The data indicating the vertex 30 does not substantially define the figure, and is therefore unnecessary. The unnecessary data, i.e., the data indicating the vertex 30 that does not define the figure, is removed from the design data, i.e., the data indicating the figure element 32, to generate data indicating the figure element 32, as indicated in the right portion in FIG. 3A. The removal of unnecessary data from the design data has the advantage of reducing the amount of data to be processed.

FIG. 3B is an illustration showing the process of adding data indicating evaluation points to the design data.

In FIG. 3B, as indicated in the left portion, data indicating a figure element 36 includes data indicating six vertices 33, and data indicating a figure element 37 includes data indicating four vertices 33.

In the process of adding data indicating evaluation points to the design data, data indicating evaluation points 35 is added between the data indicating the vertices 33 of the figure element 37 to generate data indicating a figure element 37 including data indicating four vertices 33 and four evaluation points 35, as indicated in the right portion in FIG. 3B. That is, the evaluation points 35 are added to the sides of the figure element 37.

In the case of the figure element 36, in which the distance between the vertices 33 is long, mere addition of evaluation points does not allow for high-accuracy estimation of the optical proximity effect later. In this case, in the process of adding evaluation point to the design, first, the design data indicating the figure element 36 additionally includes data indicating new vertices 34, and, then, data indicating the evaluation points 35 is added between the data indicating the vertices 33 or between the data indicating the vertices 33 and the data indicating the vertices 34.

By adding the evaluation points 35, the optical proximity effect correction can be evaluated in more detail. The sides between the vertices 33 are further divided by the vertices 34, leading to high-accuracy estimation.

The process of adding data indicating evaluation points to the design data may be performed after the processing of step 20 in the flowchart shown in FIG. 2. In this case, shorter processing time and higher accuracy can be achieved.

Figure 4A:
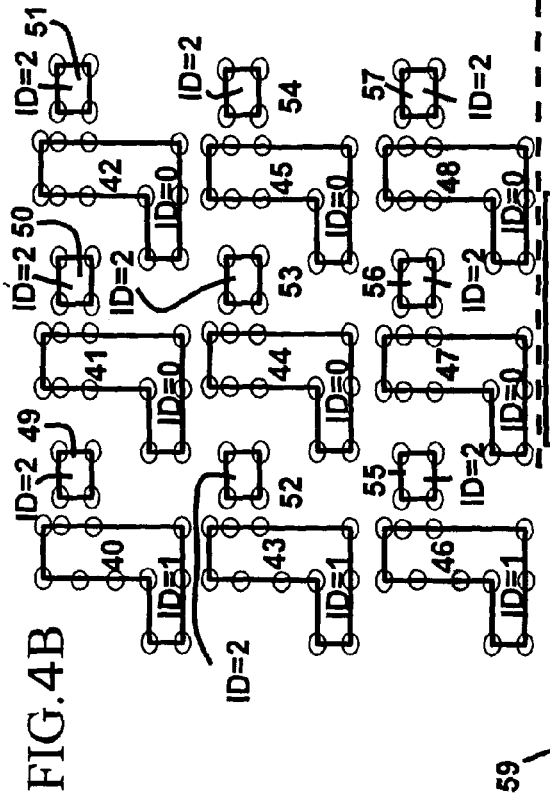
FIGS. 4A to 4C are illustrations showing a figure element extracting step and an identification data assigning step in the flowchart shown in FIG. 2.
Figure 4B:
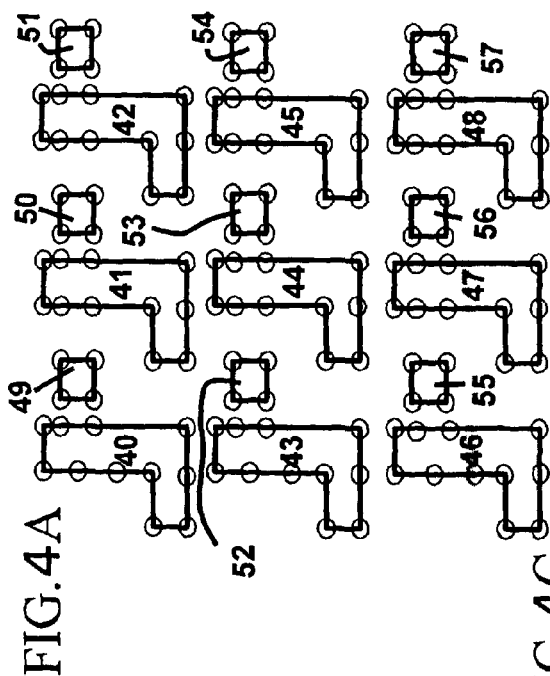
Figure 4C:
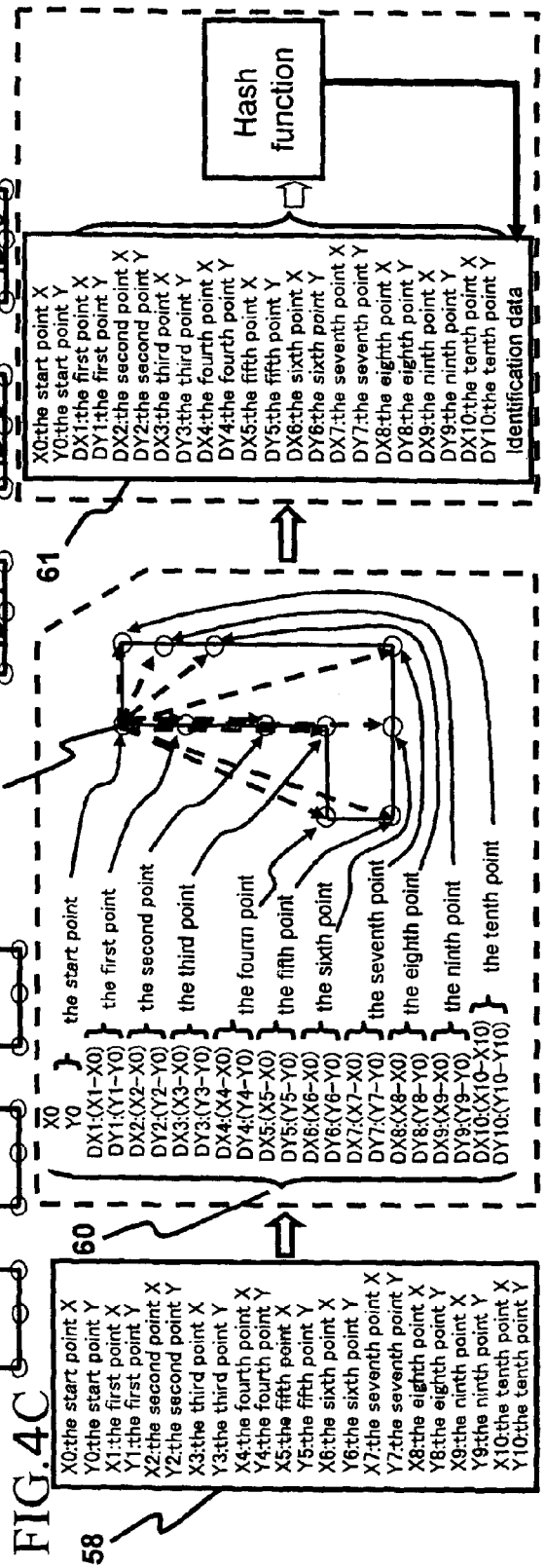

FIGS. 4A to 4C are illustrations showing the processing of steps 17 and 18 in the flowchart shown in FIG. 2.

In step 17, data indicating one figure element is extracted from the design data. In step 18, identification data is generated based on the data indicating the figure element by applying the hash function to, for example, the relative coordinates of the vertices or the start-point coordinates and the relative coordinates of the vertices, and the identification data is added to the data indicating the figure element.

The processing of steps 17 and 18 will be described hereinafter with reference to FIGS. 4A to 4C. In FIGS. 4A to 4C, the same portions are assigned the same reference numerals.

FIG. 4A shows a metal thin-film pattern on a reticle, including a set of figure elements 40 to 57. The figure elements 40 to 48 are inverse-L-shaped patterned figures each having 11 vertices, and the figure elements 49 to 57 are rectangular patterned figures each having four vertices. FIG. 4A shows a grid of three rows by three columns of patterned figures each including a rectangular patterned figure and an inverse-L-shaped patterned figure.

FIG. 4B shows the metal thin-film pattern that has been subjected to the processing of steps 17 and 18, in which the figure elements 40 to 57 shown in FIG. 4A are assigned identification data indicated by ID=0, ID=1, and ID=2. Specifically, the figure elements 40, 43, and 46 corresponding to the inverse-L-shaped patterned figures have ID=1. The figure elements 41, 42, 44, 45, 47, and 48 corresponding to the inverse-L-shaped patterned figures have ID=0. The figure elements 49 to 57 corresponding to the rectangular patterned figures have ID=2.

FIG. 4C is an illustration showing the process of extracting data indicating one figure element from the design data, and the process of applying the hash function to the data indicating the figure element to generate identification data and adding the identification data to the data indicating the figure element.

First, design data 58 includes a set of vertex coordinate data of a figure element, which are indicated by "X0: the start point X", "Y0: the start point Y", "X1: the first point X", "Y1: the first point Y", "X2: the second point X", "Y2: the second point Y", "X3: the third point X", "Y3: the third point Y", "X4: the fourth point X", "Y4: the forth point Y", "X5: the fifth point X", "Y5: the fifth point Y", "X6: the sixth point X", "Y6: the sixth point Y", "X7: the seventh point X", "Y7: the seventh point Y", "X8: the eighth point X", "Y8: the eighth point Y", "X9: the ninth point X", "Y9: the ninth point Y", "X10: the tenth point X", and "Y10: the tenth point Y".

In the process of extracting data indicating one figure element from the design data, first, vertex coordinate data associated with a figure element 59 having the start point and the first to tenth points as vertices is extracted from the design data 58, and is configured as a set of data. Then, the uppermost leftmost vertex is defined as the start point (X0, Y0), and the relative coordinates (DX1, DY1, DX2, DY2, DX3, DY3, DX4, DY4, DX5, DY5, DX6, DY6, DX7, DY7, DX8, DY8, DX9, DY9, DX10, and DY10) from the start-point vertex of the figure element 59 are determined from the vertex data belonging to the set of data, and data 60 indicating the figure element 59 collectively including the start-point data and the relative coordinates of the vertices is created.

In the process of applying the hash function to the data indicating the figure element to generate identification data and adding the identification data to the data indicating the figure element, first, identification data is generated based on the data 60 by, for example, applying the hash function to the relative coordinates of the vertices of the figure element 59. The identification data generated by the hash function even based on different figure elements may be the same. Thus, figure elements having the identical identification data are compared, and are further assigned different identification data. Although identification data indicated by a number, such as ID=0, ID=1, and ID=2, are shown in FIG. 4B, data indicating a symbol, etc., may be used as identification data. The hash function is a function which converts given original text, original numbers, or original coordinates into a character or number string having a fixed length in order to acquire a key allowing for high-speed search using the hash method. Then, the identification data is assigned to the data 60 to produce data 61 indicating the figure element 59 assigned with the identification data. It is to be understood that the data 60 indicating the same figure element is assigned the identical identification data.

Figures 5A, 5B, 5C:
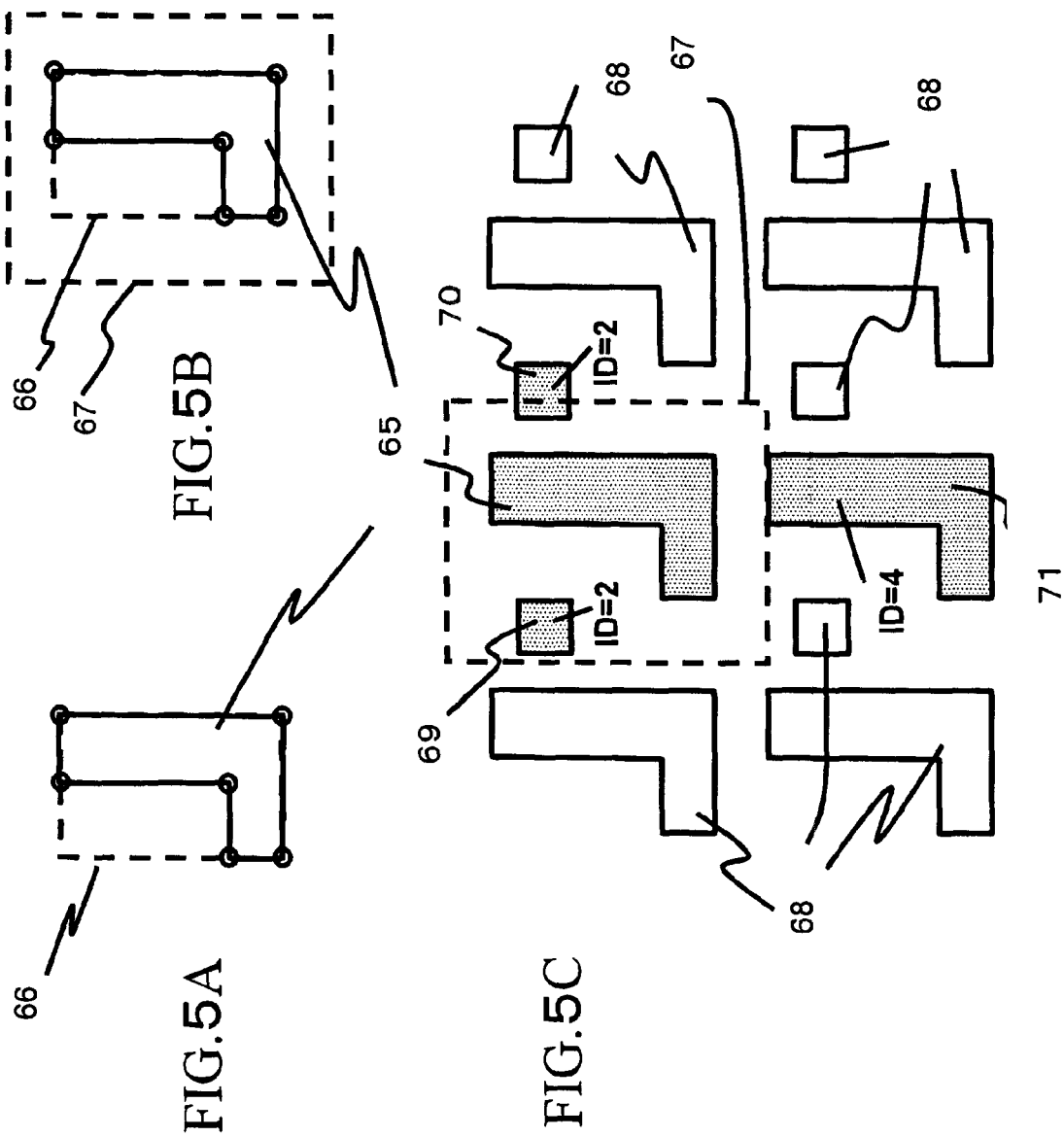
FIGS. 5A to 5C are illustrations showing a figure element group setting step in the flowchart shown in FIG. 2.

FIGS. 5A to 5C are illustrations showing the processing of step 19 in the flowchart shown in FIG. 2.

The processing of step 19 includes a process of setting a figure region based on a figure element to be corrected, and a process of extracting a figure element group overlapping or adjacent to the figure region. In the process of setting a figure region based on a figure element to be corrected, a figure outer frame is defined with respect to a figure element, and the figure outer frame is enlarged to configure a figure region. In the process of extracting a figure element group overlapping or adjacent to the figure region, a figure element group overlapping or adjacent to the figure region is identified based on the identification data assigned to data indicating the figure element, and a data group indicating the figure element group is extracted.

The process of setting a figure region based on a figure element to be corrected will be described with reference to FIGS. 5A and 5B, and the process of extracting a figure element group overlapping or adjacent to the figure region will be described with reference to FIG. 5C. In FIGS. 5A to 5C, the same portions are assigned the same reference numerals.

FIG. 5A shows a figure outer frame 66 based on a figure element 65 to be corrected, which is used in the process of setting a figure region based on a figure element to be corrected. One point defining the figure outer frame 66 is the maximum point expressed by the X coordinate having the maximum value and the Y coordinate having the maximum value in the X and Y coordinates of vertices of the figure element 65 to be corrected. The other point defining the figure outer frame 66 is the minimum point expressed by the X coordinate having the minimum value and the Y coordinate having the minimum value in the X and Y coordinates of the vertices of the figure element 65.

FIG. 5B shows a figure region 67 that is formed by enlarging the figure outer frame 66 by a certain factor. The enlargement factor is determined so that the figure region 67 is equal to a region that is determined to be necessary for estimating the influence of the optical proximity effect on the figure outer frame 66 of the designated figure element 65. Thus, the enlargement factor depends upon the conditions, such as the size of the figure element 65 and the optical wavelength used for radiation. Since the influence of the optical proximity effect is estimated by simulation using a computer, the enlargement factor varies depending upon the performance of the computer used for the numerical calculation. While the figure region 67 is formed by enlarging the figure outer frame 66 by a certain factor, the figure region 67 may be formed by enlarging the figure outer frame 66 by a certain width.

FIG. 5C is an illustration showing the process of identifying a figure element group overlapping or adjacent to the figure region 67 based on the identification data assigned to the data indicating the figure element 65 and extracting a data group indicating the figure element group. First, in the process of identifying a figure element group overlapping or adjacent to the figure region 67 based on the identification data assigned to the data indicating the figure element 65, figure elements 69 and 70 which at least partially overlap or are at least partially included in the figure region 67 shown in FIG. 5C are identified from other figure elements 68 based on identification data assigned to data indicating the figure elements 69 and 70. In the process of identifying a figure element group overlapping or adjacent to the figure region 67 based on the identification data assigned to the data indicating the figure element 65, a figure element 71 adjacent to the figure region 67 is also identified from the other figure elements 68 based on identification data assigned to data indicating the figure element 71. Thereafter, in the process of extracting a data group indicating the figure element group, the extracted figure elements 69, 70, and 71 are combined into a figure element group, and a data group indicating the figure element group is created.

Figure 6A:
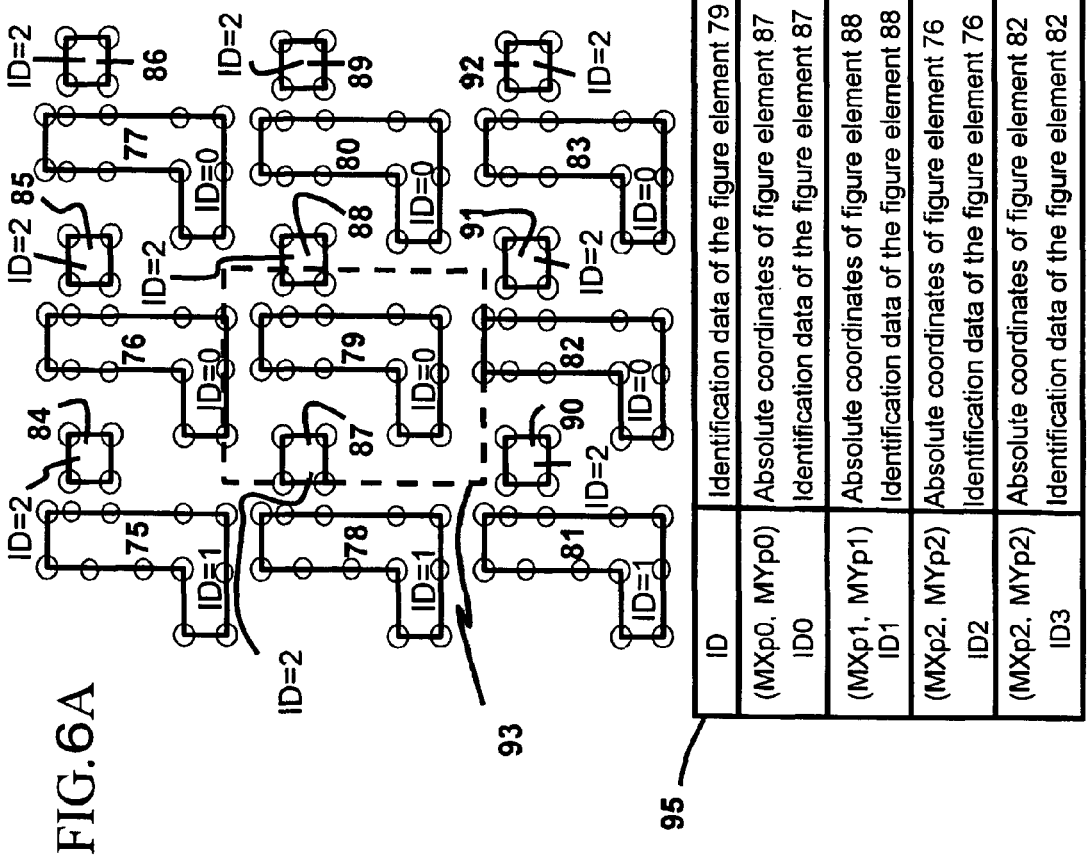
FIGS. 6A and 6B are illustrations showing a step of assigning identification data to a data group indicating a figure element group in the flowchart shown in FIG. 2.
Figure 6B:
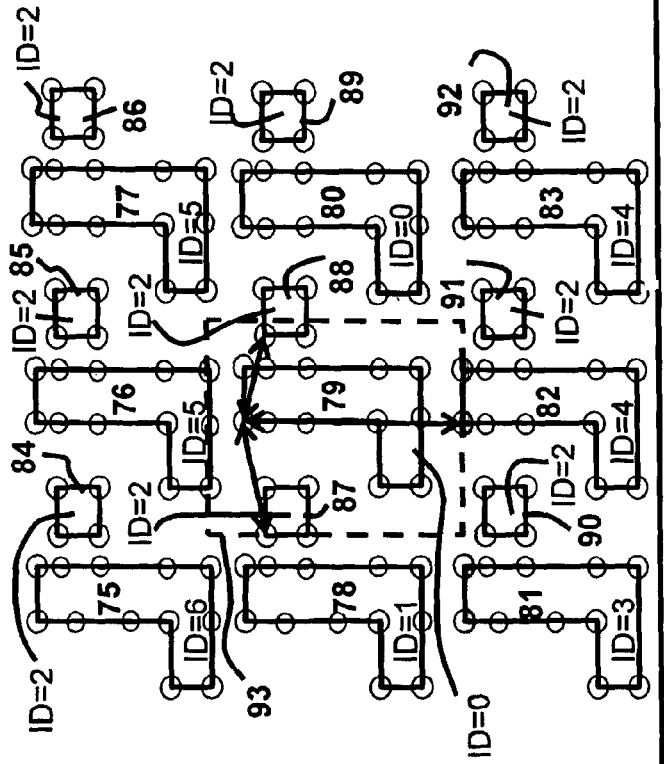

FIGS. 6A and 6B are illustrations showing the process of assigning identification data to the data indicating the figure element group (step 20 in the flowchart shown in FIG. 2).

In the process of assigning identification data to the data group indicating the figure element group, the absolute coordinates of vertices of figure elements, which are included in an identification data group assigned to the data group indicating the figure element group and the data indicating the figure element, are converted into the relative coordinates from the coordinates of the vertices of the designated figure element, and the hash function is applied to the converted relative coordinates to generate identification data. The generated identification data is assigned to the data group indicating the figure element group.

In FIGS. 6A and 6B, the same portions are assigned the same reference numerals.

FIG. 6A shows an identification data group 95 assigned to a data group indicating a figure element group including the absolute coordinates with respect to a designated figure element 79 and data indicating the figure element 79. In FIG. 6A, figure elements 75 to 78 and 80 to 92 are adjacent to the figure element 79, and a figure region 93 is defined with respect to the figure element 79.

In FIG. 6A, the identification data group 95 includes "ID: identification data of the figure element 79", "(MXp0, MYp0): the absolute coordinates of the figure element 87", "ID0: identification data of the figure element 87", "(MXp1, MYp1): the absolute coordinates of the figure element 88", "ID1: identification data of the figure element 88", "(MXp2, MYp2): the absolute coordinates of the figure element 76", "ID2: identification data of the figure element 76", "(MXp3, MYp3): the absolute coordinates of the figure element 82", and "ID3: identification data of the figure element 82".

For example, the description "(MXp0, MYp0): the absolute coordinates of the figure element 87" means that the start-point vertex of the figure element 87 is expressed by the absolute coordinates and the coordinates of the other vertices are expressed by the relative coordinates from the start-point vertex. The same applies to "(MXp1, MYp1): the absolute coordinates of the figure element 88", "(MXp2, MYp2): the absolute coordinates of the figure element 76", and "(MXp3, MYp3): the absolute coordinates of the figure element 82".

The description "ID: identification data of the figure element 79" means identification data that is generated by applying the hash function to the data indicating the figure element 79 and that is assigned to the data indicating the figure element 79. The same applies to "ID0: identification data of the figure element 87", "ID1: identification data of the figure element 88", "ID2: identification data of the figure element 76", and "ID3: identification data of the figure element 82".

FIG. 6B is an illustration showing the process of assigning identification data to the data group indicating the figure element group (step 20 in the flowchart shown in FIG. 2). In FIG. 6B, the figure region 93, indicated by a dotted line, is defined with respect to the designated figure element 79. FIG. 6B shows that the figure elements 87, 88, 76, and 82 are extracted. FIG. 6B also shows that the figure elements 75, 77, 78, 80, 81, 83, 84, 85, 86, 89, 90, 91, and 92 are adjacent to the figure element 79.

In the process of assigning identification data to the data group indicating the figure element group, first, the vertex coordinates of the figure elements 87, 88, 76, and 82 in the identification data group 95 are converted from the absolute coordinates to the relative coordinates from the vertex coordinates of the designated figure element 79.

Specifically, the relative coordinates are determined by subtracting the values of the coordinates of the start-point vertex of the figure element 79 from the values of the coordinates of the start-point vertices of the figure elements 87, 88, 76, and 82. Then, the coordinates of the other vertices of the figure elements, which are expressed by the relative coordinates from the coordinates of the start-point vertices of the figure elements 87, 88, 76, and 82, are added to configure a data table 96. The data table 96 includes data indicating the figure elements 87, 88, 76, and 82 including the relative coordinates, and identification data assigned to the data indicating the figure elements 79, 87, 88, 76, and 82. In FIG. 6B, the data indicating the figure elements 87, 88, 76, and 82 including the relative coordinates includes "ID: identification data of the figure element 79", "(Xp0, Yp0): the relative coordinates of the figure element 87 ((the start-point coordinates of the figure element 87)—(the start-point coordinates of the Figure element 79))", "ID0: identification data of the figure element 87", "(Xp1, Yp1): the relative coordinates of the figure element 88 ((the start-point coordinates of the figure element 88)—(the start-point coordinates of the figure element 79))", "ID1: identification data of the figure element 88", "(Xp2, Yp2): the relative coordinates of the figure element 76 ((the start-point coordinates of the figure element 76)—(the start-point coordinates of the figure element 79))", "ID2: identification data of the figure element 76", "(XpP3, Yp3): the relative coordinates of the figure element 82 ((the start-point coordinates of the figure element 82)—(the start-point coordinates of the figure element 79))", and "ID3: identification data of the figure element 82".

Then, identification data F(ID, Xp0, Yp0, ID0, Xp1, Yp1, ID1, Xp2, Yp2, ID2, Xp3, Yp3, ID3) including a character or number string having a fixed length is generated. This identification data is generated by applying the hash function using the description "ID: identification data of the figure element 79", "(Xp0, Yp0): the relative coordinates of the figure element 87 ((the start-point coordinates of the figure element 87)-(the start-point coordinates of the figure element 79))", "ID0: identification data of the figure element 87", "(Xp1, Yp1): the relative coordinates of the figure element 88 ((the start-point coordinates of the figure element 88)—(the start-point coordinates of the figure element 79))", "ID1: identification data of the figure element 88", "(Xp2, Yp2): the relative coordinates of the figure element 76 ((the start-point coordinates of the figure element 76)—(the start-point coordinates of the figure element 79))", "ID2: identification data of the figure element 76", "(XpP3, Yp3): the relative coordinates of the figure element 82 ((the start-point coordinates of the figure element 82)—(the start-point coordinates of the figure element 79))", and "ID3: identification data of the figure element 82". The identification data generated by the hash function even based on different figure element groups may be the same. Thus, figure element groups having the identical identification data are compared, and are further assigned different identification data. The data table 96 including data indicating a figure element group including the relative coordinates and identification data is thus created. Although identification data indicated by a number, such as ID=0, ID=1, ID=2, ID=3, ID=4, ID=5, and ID=6, are shown in FIG. 6B, data indicating a symbol, etc., may be used as identification data.

Figure 7A:
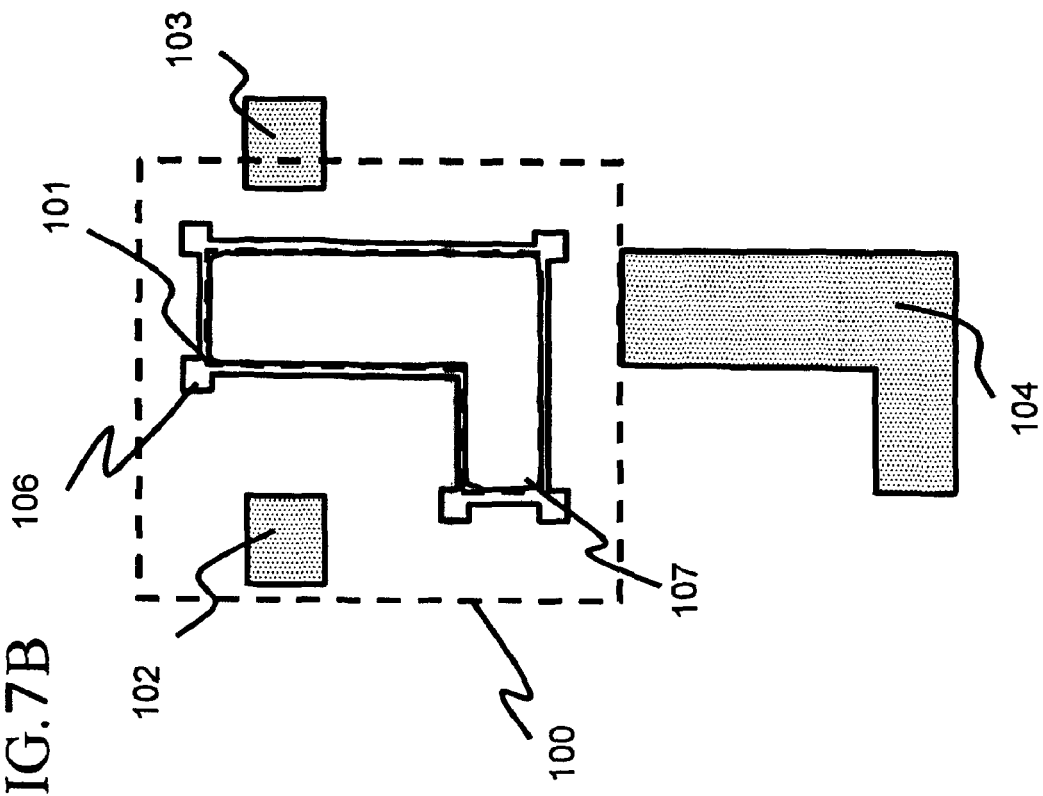
FIGS. 7A and 7B are illustrations showing an optical proximity effect estimating step and a corrected-figure generating step in the flowchart shown in FIG. 2.
Figure 7B:
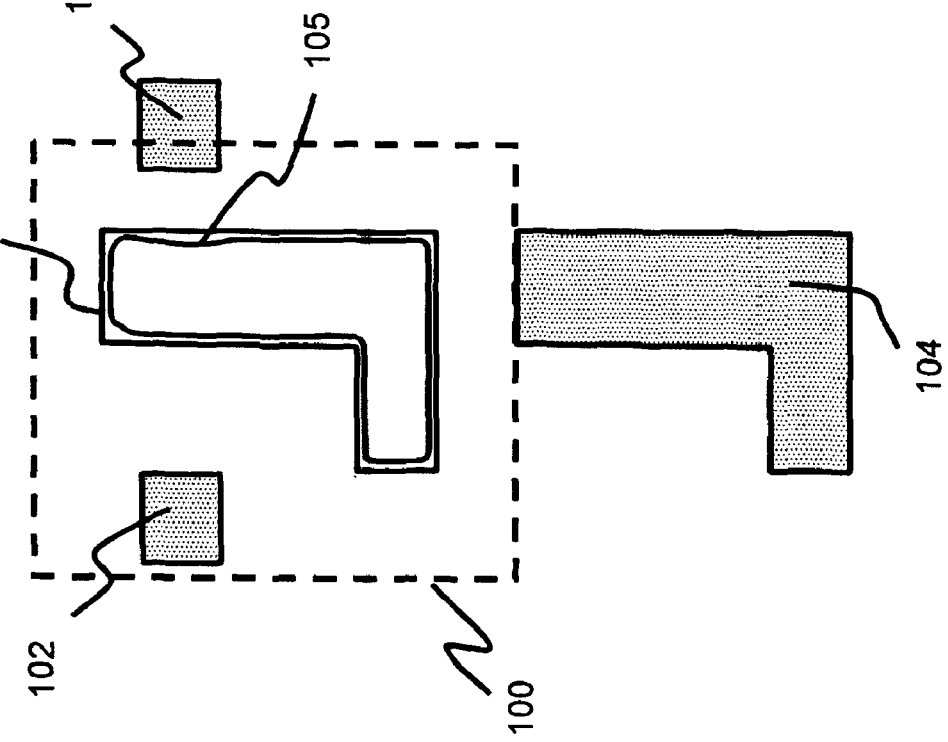

FIGS. 7A and 7B are illustrations showing the processing of steps 21 and 22 in the flowchart shown in FIG. 2.

In step 21, the influence of the optical proximity effect on the shape of a projected image produced by applying light to a figure element is estimated by computer-based simulation. In step 22, a corrected figure element in which the shape of the figure element is corrected so that the shape of the projected image becomes similar to the shape of the figure element is generated.

In FIGS. 7A and 7B, the same portions are assigned the same reference numerals.

FIG. 7A is an illustration showing the process of estimating the influence of the optical proximity effect on the shape of a projected image produced by applying light to a figure element by computer-based simulation. In FIG. 7A, figure elements 102, 103, and 104 are extracted in a figure region 100 defined with respect to a designated figure element 101. A projected image 105 of the designated figure element 101 is predicted by computer-based simulation.

In the process of estimating the influence of the optical proximity effect, the projected image 105 of the designated figure element 101 is determined by computer-based simulation. The projected image 105 is a projected image produced by applying light to the designated figure element 101, taking the optical proximity effect into consideration. In general, the vertex portions of the projected image 105 are quadrant-shaped but not right-angled due to the effect of the optical proximity effect. The sides of the projected image 105 are generally inside the sides of the designated figure element 101. Moreover, for example, a portion of the designated figure element 101 which is adjacent to the figure element 103 is strongly affected by the optical proximity effect resulting from the figure element 103, and is therefore shaped into concave.

Then, the shape of the designated figure element 101 is compared with the projected image 105 to estimate the influence of the optical proximity effect.

FIG. 7B is an illustration showing the process of generating a corrected figure element in which the shape of the figure element is corrected so that the shape of the projected image becomes similar to the shape of the figure element. FIG. 7B shows the designated figure element 101, the figure region 100, and the extracted figure elements 102, 103, and 104. FIG. 7B also shows a corrected figure element 106 produced by performing a corrected-figure generation process on the designated figure element 101. In FIG. 7B, a projected image 107 is predicted with respect to the corrected figure element 106 by computer-based simulation.

In the process of generating a corrected figure element in which the shape of the figure element is corrected so that the shape of the projected image becomes similar to the shape of the figure element, the shape of the projected image 107 produced by computer-based simulation is compared with the shape of the designated figure element 101. Then, the designated figure element 101 is corrected so that the shape of the projected image 107 becomes similar to the designated figure element 101, and the corrected figure element 106 is generated. For example, correction is performed so that the corrected figure element 106 additionally includes small rectangular figures at the vertex portions thereof in order to prevent the vertex portions of the projected image 107 from being shaped into quadrant. Correction is further performed so that the sides of the corrected figure element 106 become outside the sides of the designated figure element 101. The shape of the projected image 107 of the corrected figure element 106 is therefore similar to the shape of the designated figure element 101.

The processing of steps 21 and 22 is performed on one of the figure elements having the identical identification data shown in FIG. 4C in a figure element group having the identical identification data shown in FIG. 6B when this figure element group resides in the figure region 100.

That is, when figure elements of the metal thin-film pattern on the photomask are classified using the identification data shown in FIG. 6B and the identification data shown in FIG. 4C, a figure element that is determined to be unique is corrected, and a corrected figure is generated.

In this classification of figure elements, generally, a long time is required for searching or sorting if data indicating the figure elements includes only coordinate data. In the first embodiment, however, identification data is generated based on the hash function, and the time for searching or sorting can therefore be reduced.

Figure 8A:
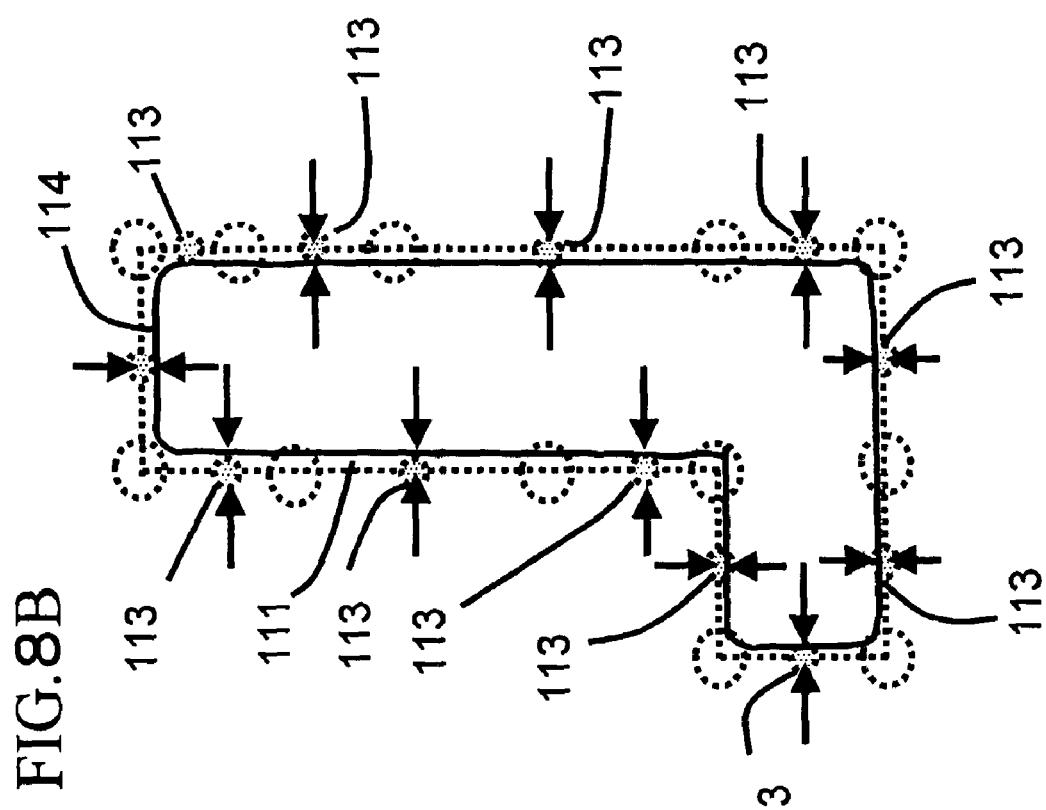
FIGS. 8A and 8B are illustrations showing an inspection step for a corrected figure element generated in the flowchart shown FIG. 2.
Figure 8B:
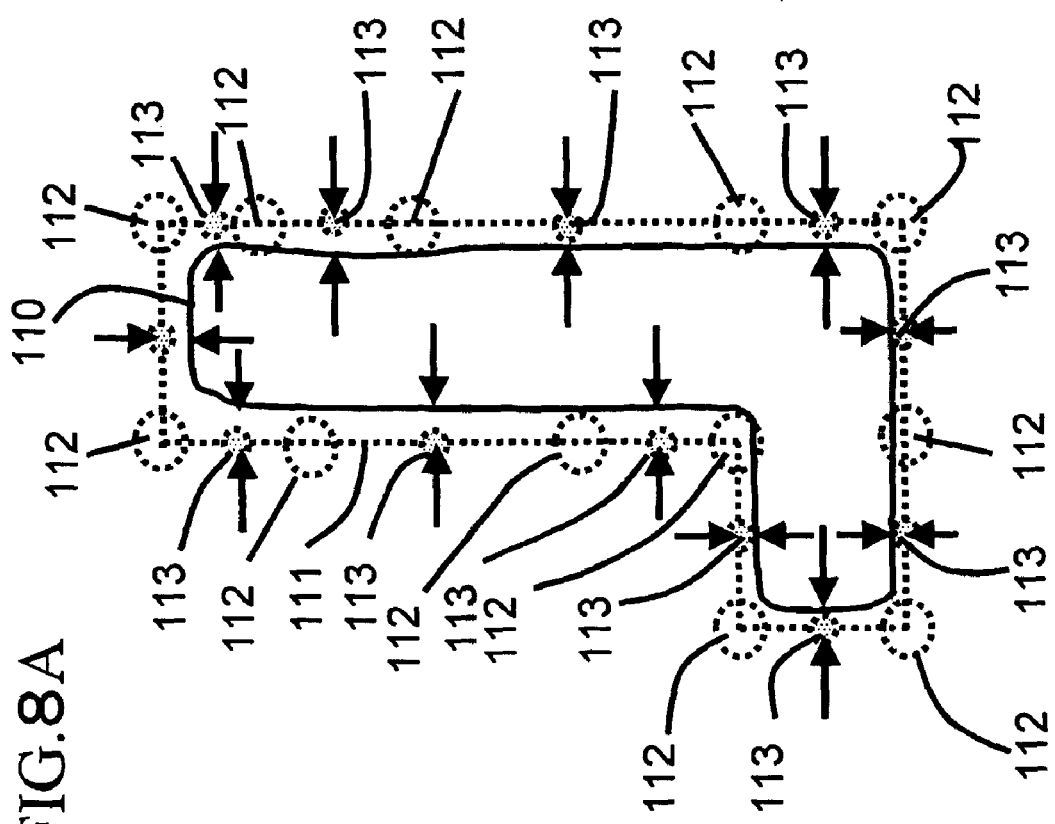

FIGS. 8A and 8B are illustrations showing the process of inspecting the corrected figure element (step 23 in the flowchart shown in FIG. 2).

In the processing of step 23, evaluation points of a figure element are compared with evaluation points of a projected image of the figure element to inspect deformation of the projected image due to the optical proximity effect, and the consistency in shape between the projected image and the figure element is checked.

FIG. 8A shows that a figure element 111 and a projected image 110 of the figure element 111 are compared at evaluation points 113 to inspect deformation of the projected image 110 due to the optical proximity effect. In FIG. 8A, the figure element 111 having vertices 112 is indicated by a dotted line, and the vertices 112 are indicated by large dotted circles. The evaluation points 113 are indicated by small dotted circles. The projected image 110 shown in FIG. 8A is indicated by a solid line.

In FIG. 8A, the figure element 111 and the projected image 110 of the figure element 111 are compared at the evaluation points 113, as indicated by black arrows, thereby inspecting deformation of the projected image 110 due to the optical proximity effect. This inspection is performed using data indicating the figure element 111, data of the evaluation points 113 included in the data indicating the figure element 111, and data indicating the projected image 110. While the figure element 111 and the projected image 110 of the figure element 111 are compared at the evaluation points 113 in FIG. 8A, the comparison may be performed at the vertices 112 and a comparison result may be used in the inspection process. In this case, the allowable error increases when a vertex is at the corner. The accuracy of the inspection can be enhanced by using a combination of the comparison at the vertices 112 between the figure element 111 and the projected image 110 and the comparison at the evaluation points 113 on the sides of the figure element 111 and the projected image 110.

FIG. 8B shows that the figure element 111 and a projected image 114 of a corrected figure element generated by simulation are compared at the evaluation points 113 to determine the consistency in shape between the projected image 114 and the figure element 111.

In FIG. 8B, a dotted line, large dotted circles, and small dotted circles indicate similar portions to those shown in FIG. 8A. In FIG. 8B, a solid line indicates the projected image 114.

In FIG. 8B, the figure element 111 and the projected image 114 of the corrected figure element are compared at the evaluation points 113, as indicated by black arrows. Also, the inspection described above is performed by computer-based simulation using data indicating the object to be inspected. While the figure element 111 and the projected image 114 of the corrected figure element are compared at the evaluation points 113 in FIG. 8B, the comparison may be performed at the vertices 112 and a comparison result may be used in the inspection process. In this case, the allowable error increases when a vertex is at the corner. Then, it is determined (in step 23 in the flowchart shown in FIG. 2) whether or not the difference in shape between the projected image 114 of the corrected figure element and the figure element 111 is within a predetermined range as a result of the inspection. If the difference is within the predetermined range, this corrected figure element is used as the desired corrected figure element. If the difference in shape between the projected image 114 of the corrected figure element and the figure element 111 is not within the predetermined range, the process returns to step 19 in the flowchart shown in FIG. 2, and another corrected figure element is produced.

The processing of step 24 in the flowchart shown in FIG. 2 will be described with reference to FIGS. 9 and 10. In step 24, data indicating the corrected figure element and data indicating the figure element are associated based on the identification data shown in FIG. 6B. The data indicating the corrected figure element is further distributed to data indicating other figure elements having the identical identification data, thereby actually converting design data that is configured to indicate the figure element into figure data for forming the metal film pattern on the photomask.

Figure 9:
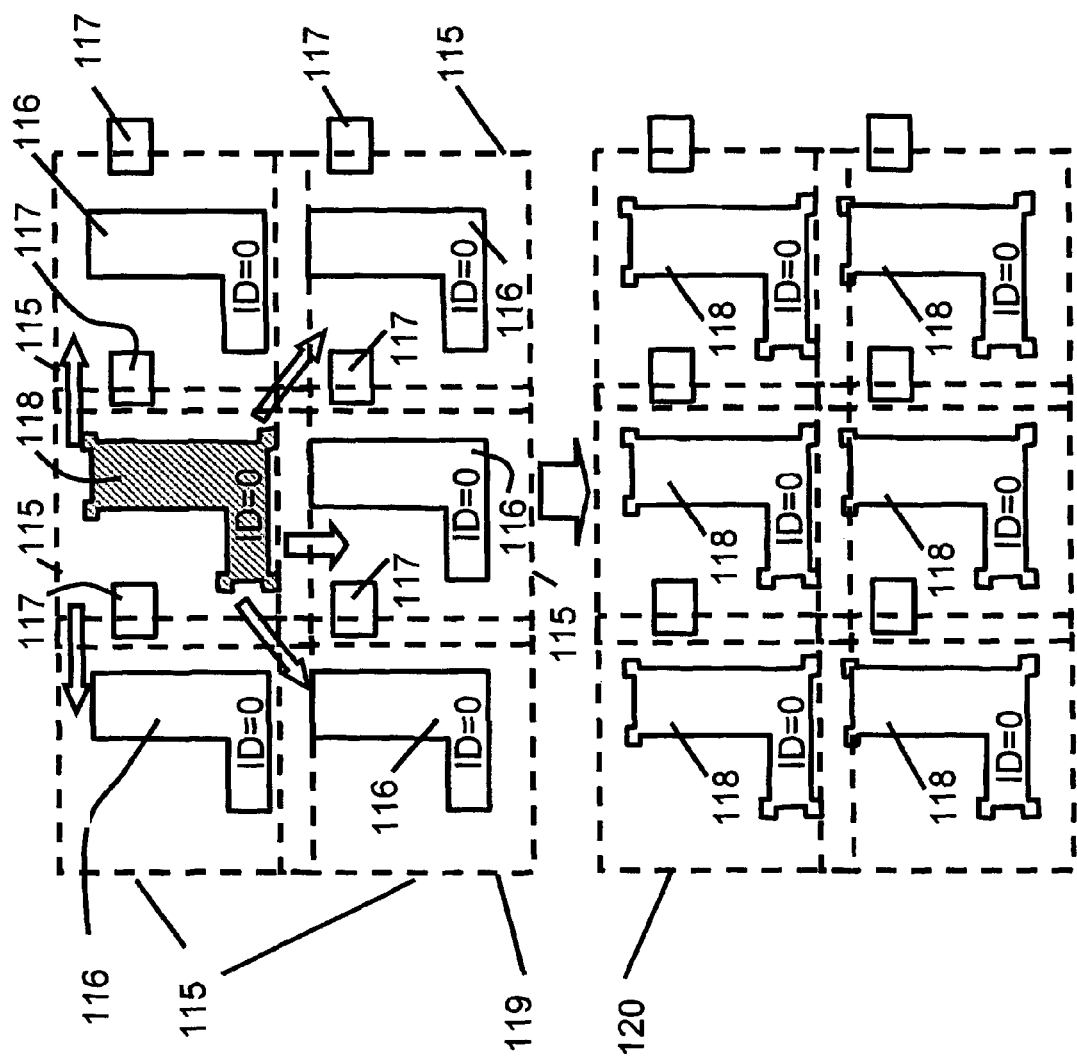
FIG. 9 is an illustration showing a step of associating data indicating a corrected figure element with data indicating a figure element based on the identification data shown in FIG. 6B and distributing the data indicating the corrected figure element to data indicating other figure elements.

FIG. 9 is an illustration showing the process of associating data indicating a corrected figure element with data indicating a figure element based on the identification data shown in FIG. 6B and distributing the data indicating the corrected figure element to data indicating other figure elements. FIG. 9 shows an original two-row-by-three-column figure 119, and a two-row-by-three-column figure 120 after performing distribution. A two-row-by-three-column figure is a grid of two rows by three columns of arbitrary figure elements in an n row by m column figure group having a plurality of figure elements, where n and m are natural numbers more than four, and excludes peripheral columns or peripheral rows.

In the process of associating data indicating a corrected figure element with data indicating a figure element based on the identification data shown in FIG. 6B, therefore, in the original two-row-by-three-column figure 119 shown in FIG. 9, figure elements 116 in which a figure element group having certain identification data, e.g., ID=0, resides in a figure region 115 are replaced with a hatched corrected figure element 118.

In the process of distributing the data indicating the corrected figure element to data indicating other figure elements having the identical identification data, in the original two-row-by-three-column figure 119 shown in FIG. 9, the figure elements 116 in which a figure element group having the identical identification data, e.g., ID=0, resides in the figure region 115 are replaced with the same corrected figure element 118, and the two-row-by-three-column figure 120 shown in FIG. 9 is thus created.

For convenience of illustration, in the foregoing description, distribution of a figure element is performed using figure elements. A figure element is distributed by a computer, and this processing may therefore be performed using indicating the figure elements 116 and 117, the corrected figure element 118, etc.

Figure 10:
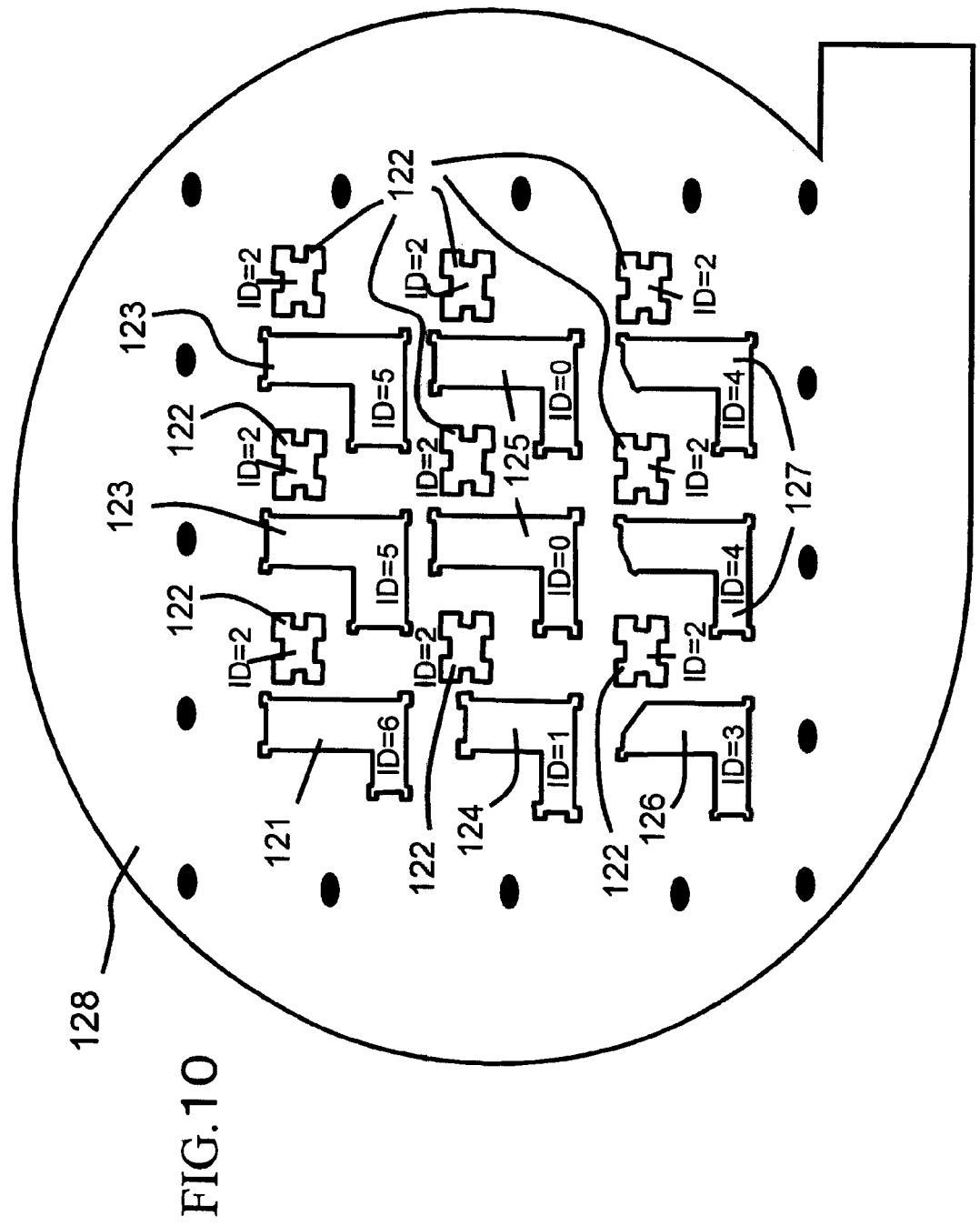
FIG. 10 is an illustration showing a step of actually converting design data that is configured to indicate the figure element into figure data for forming a metal-film pattern on a reticle.

FIG. 10 is an illustration showing the process of actually converting design data that is configured to indicate the figure element into figure data for forming the metal-film pattern on the reticle.

In FIG. 10, figure data 128 includes a figure element 121 having a figure element group assigned with identification data ID=6, corrected figure elements 122 having a figure element group assigned with identification data ID=2, corrected figure elements 123 having a figure element group assigned with identification data ID=5, a corrected figure element 124 having a figure element group assigned with identification data ID=1, corrected figure elements 125 having a figure element group assigned with identification data ID=0, a corrected figure element 126 having a figure element group assigned with identification data ID=3, and figure elements 127 having a corrected figure element group assigned with identification data ID=4.

In the process of actually converting design data that is configured to indicate the figure element into figure data for forming the metal film pattern on the reticle, the process of associating data indicating a corrected figure element with data indicating a figure element based on the identification data shown in FIG. 6B and distributing the data indicating the corrected figure element to data indicating other figure elements is performed on all figure elements.

As shown in FIG. 10, the figure data 128 indicating the metal film figures on the reticle includes data indicating the corrected figure elements 121 to 127.

The more details of the association process based on the identification data shown in FIG. 6B will be described. First, data indicating a corrected figure element includes the origin coordinates indicating the start point, and the relative coordinates of the other vertices from the start point. Therefore, the data indicating the corrected figure element does not have the absolute coordinates. On the other hand, data indicating a figure element which the data indicating the corrected figure element is based on has the absolute coordinates; this data includes the absolute coordinates indicating the start point and the relative coordinates indicating the other vertices from the start point.

The absolute coordinates of the data indicating the figure element and identification data of a figure element group included in a figure region that is defined to correct for the shape of the figure element are extracted from data indicating the figure element group. Thereafter, the data indicating the corrected figure element and the absolute coordinates are associated based on the identification data. This operation corresponds to the association process based on the identification data shown in FIG. 6B.

Figure 11:
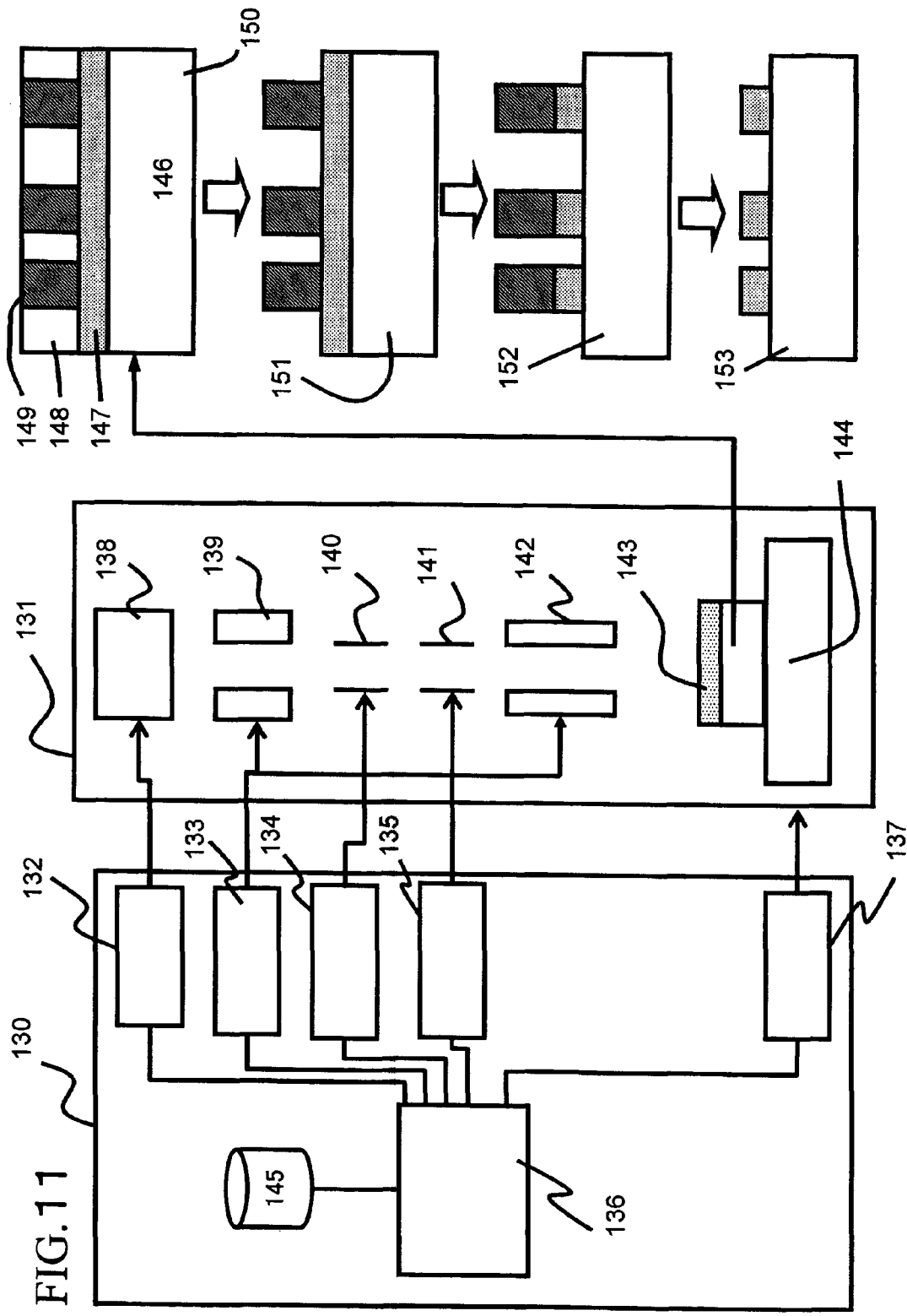
FIG. 11 is an illustration showing a step of forming an exposure pattern on the reticle, a line width checking step, and a step of forming a metal thin-film pattern by etching in the flowchart shown in FIG. 1, which are performed using the figure data shown in FIG. 10.

FIG. 11 is a diagram showing the process of forming an exposure pattern on a reticle, checking the line width, and forming a metal thin-film pattern by etching (steps 6 to 8 in the flowchart shown in FIG. 1) using the figure data 128 shown in FIG. 10.

In FIG. 11, a figure drawing device includes a control unit 130 and a beam emission unit 131.

The beam emission unit 131 of the figure drawing device includes a beam emitter 138, an electrostatic lens 139 focusing a beam, a beam-blank 140 having the function of blocking the beam, a deflector 141 controlling the direction of the beam, an electrostatic lens 142 focusing the beam onto an object to be irradiated with the beam, and a stage 144 having a photomask (or reticle) 143, e.g., a reticle, mounted thereon. The control unit 130 of the graphic drawing device functions to control the beam emission unit 131 and to control emission of a beam based on figure data 145 stored therein. The control unit 130 includes a beam controller 132 controlling the beam emitter 138, a lens controller 133 controlling the electrostatic lenses 139 and 142, a beam-blank controller 134 controlling the beam blank 140, a deflector controller 135 controlling the deflector 141, a stage controller 137 controlling the stage 144, and a controller 136. The controller 136 controls the beam controller 132, the lens controller 133, the beam-blank controller 134, the deflector controller 135, and the stage controller 137 based on the figure data 145.

The processing of step 6 in the flowchart shown in FIG. 1, in which an exposure pattern is formed on the reticle 143, is performed according to the following procedure. First, a metal thin-film 147 is deposited on a quartz plate 146, and is then coated with a resist 148. Then, the beam emitter 131 emits a beam to the resist 148 using the figure data 128 shown in FIG. 10 so as to form a desired resist pattern. Layers 150 after beam irradiation are shown in cross-section. Then, the resist 148 is removed while a resist portion 149 that is cured by beam radiation is left, thereby forming a resist pattern. Layers 151 with the resist 148 being removed are shown in cross-section.

The process of checking the line width (step 7 in the flowchart shown in FIG. 1) is then performed on the resist pattern. If the line width of the resist pattern is equal to a predetermined line width, the process proceeds to step 8 in the flowchart shown in FIG. 1.

The process of forming a metal thin-film pattern by etching (step 8 in the flowchart shown in FIG. 1) is performed according to the following procedure. First, the metal thin-film 147 is patterned by anisotropic etching using the resist pattern as a mask. Then, layers 152 with the metal thin-film 147 being etched are shown in cross-section. Then, the resist pattern is removed, thereby obtaining layers 153 in cross-section with the resist pattern being removed. The patterned metal thin-film 147 is left on the quartz plate 146, thereby forming a metal thin-film pattern on the reticle.

The method for manufacturing a reticle according to the first embodiment includes the steps of creating design data of a metal thin-film pattern on a reticle, checking the design data, generating figure data for forming a corrected metal thin-film pattern on the reticle by performing optical proximity effect correction, checking the optical proximity effect, forming an exposure pattern, checking the line width of the exposure pattern, i.e., the resist pattern, and forming a metal thin-film pattern by etching. The step of generating figure data for forming a metal thin-film pattern by performing optical proximity effect correction includes the steps of performing initial processing on design data, extracting a figure element, assigning identification data, setting a figure element group, assigning identification data, estimating the optical proximity effect, generating a corrected figure, performing inspection, and configuring figure data by distributing a corrected figure element.

According to the method for manufacturing a reticle according to the first embodiment, therefore, the time required for manufacturing the reticle can be reduced. This is because the time for generating figure data for a metal thin-film pattern on the reticle is reduced.

The time for generating the figure data is reduced because all figure elements are not subjected to the corrected-figure generation process, but only one of the figure elements having the identical identification data shown in FIG. 4C in which a figure element group having the identical identification data shown in FIG. 6B is included in a figure region is subjected to the corrected-figure generation process. Although the time for assigning identification data and for checking the conformity between the identification data is required, the process of generating identification data and checking the conformity between the identification data can be rapidly performed because the identification data is generated using the hash function. Therefore, the time for assigning identification data and checking the conformity between the identification data can greatly be reduced.

According to the method for manufacturing a reticle according to the first embodiment, furthermore, the time for manufacturing a reticle can be reduced even if a smaller grid is used as the grid of the figure data. According to the method for manufacturing a reticle according to the first embodiment, therefore, a reticle having a high-accuracy pattern can also be manufactured.

Second Embodiment

A method for manufacturing a photomask according to a second embodiment of the present invention has manufacturing processes similar to those in the method for manufacturing a photomask according to the first embodiment, except for optical proximity effect correction (step 4 in the flowchart shown in FIG. 1). An optical proximity effect correction process in the method for manufacturing a photomask according to the second embodiment will be described hereinbelow with reference to FIGS. 12 to 16.

Figure 12:
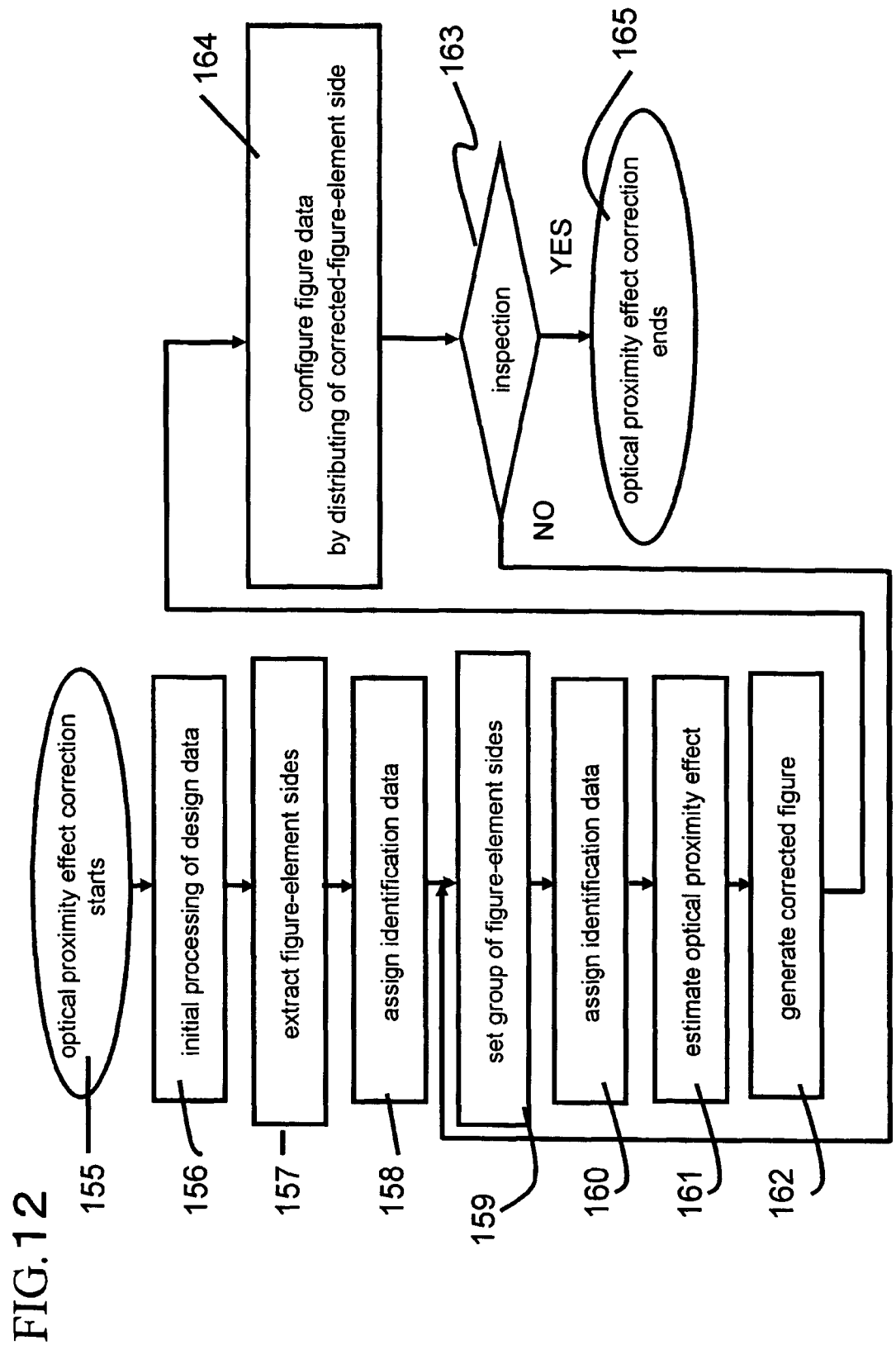
FIG. 12 is a flowchart showing the details of an optical proximity effect correction process in a method for manufacturing a photomask according to a second embodiment of the present invention.

FIG. 12 is a flowchart showing the details of the optical proximity effect correction process in the method for manufacturing a photomask according to the second embodiment. The process shown in FIG. 12 includes step 155: "optical proximity effect correction starts", step 156: "initial processing of design data", step 157: "extract figure-element sides", step 158: "assign identification data", step 159: "set group of figure-element sides", step 160: "assign identification data", step 161: "estimate optical proximity effect", step 162: "generate corrected figure", step 163: "inspection", step 164: "configure figure data by distributing of corrected-figure-element side", and step 165: "optical proximity effect correction ends".

The optical proximity effect correction process shown in FIG. 12 includes the processing of steps 156 to 164, and the processing of steps 156 to 164 will be described with reference to FIGS. 13 to 16.

Figures 13A, 13B, 13C:
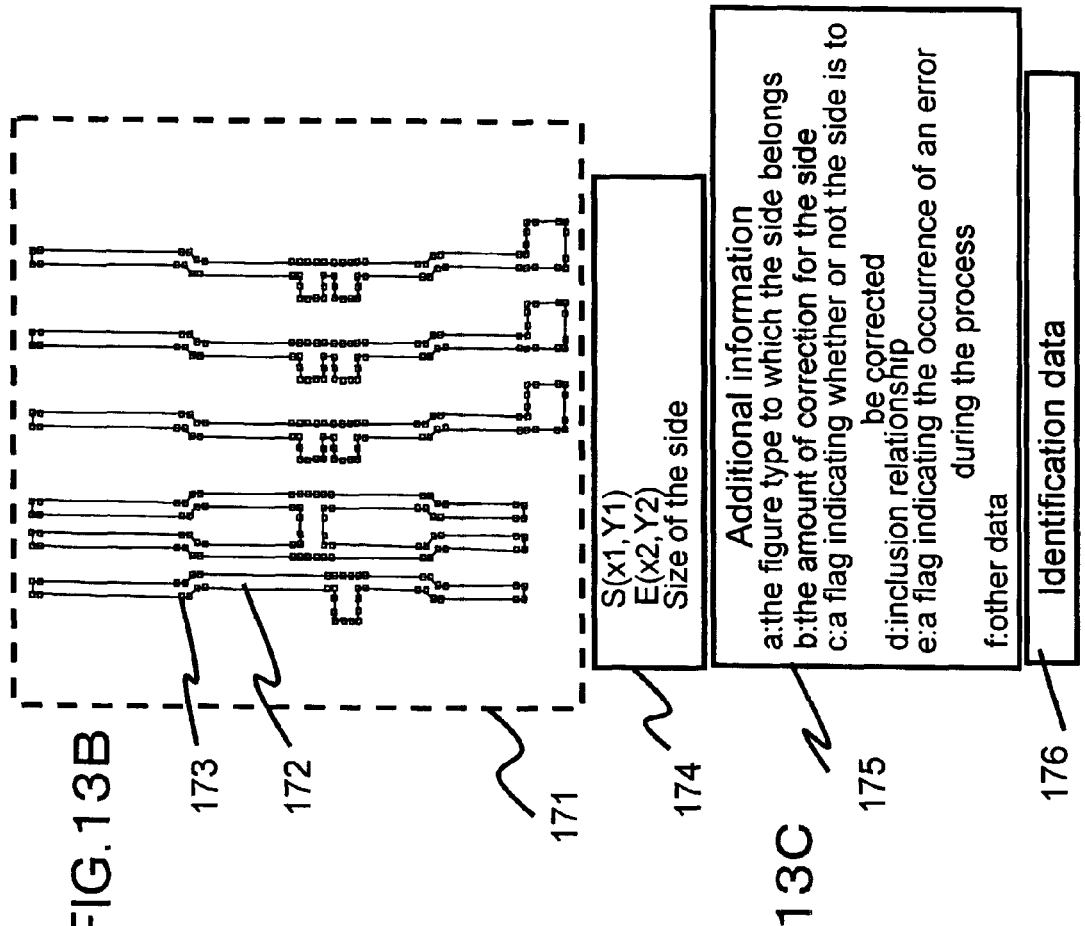
FIGS. 13A to 13C are illustrations showing a figure-element side extracting step and an identification data assigning step in the flowchart shown in FIG. 12.

FIGS. 13A to 13C are illustrations showing the processing of steps 157 and 158 in the flowchart shown in FIG. 12.

In step 157, data indicating sides of a figure element constituting design data is extracted. In step 158, identification data is generated based on the data indicating the sides of the figure element, e.g., by applying the hash function to side data 174 indicating the sides of the figure element and additional information 175, and the identification data is added to the data indicating the sides of the figure element.

In FIGS. 13A to 13C, the same portions are assigned the same reference numerals. The processing of steps 157 and 158 in the flowchart shown in FIG. 12 will now be described with reference to FIGS. 13A to 13C.

FIG. 13A shows an exemplary metal thin-film pattern on a reticle, showing a figure element section 170. The figure element section 170 includes five figure elements.

FIG. 13B shows a figure-element side section 171. The figure elements in the figure element section 170 are divided based on figure-element vertices 173. The figure-element side section 171 includes a plurality of figure-element sides 172.

FIG. 13C is an illustration showing the process of extracting data indicating sides of a figure element constituting design data, and the process of generating identification data by applying the hash function based on the data indicating the sides of the figure element and adding the identification data to the data indicating the sides of the figure element.

The figure-element side section 171 is indicated by a plurality of vertex data sets. In the process of extracting data indicating sides of a figure element constituting design data, first, vertex data sets defining sides of each figure element are extracted. Then, one vertex data set is used as start-point data (expressed by S(x1, y1) in FIG. 13C), and the other vertex data set is used as end-point data (expressed by E(x2, y2) in FIG. 13C) so that the left side becomes the inside of the figure. Thus, vector data having the start point and the end point as elements, i.e., data including S(x1, y1) and E(x2, y2), is extracted as figure-element side data 174. Additional information data 175 is added to the vector data. The additional information data 175 may include, for example, "a: the figure type to which the side belongs", "b: the amount of correction for the side", "c: a flag indicating whether or not the side is to be corrected", "d: the inclusion relationship (indicating whether or not this figure is inside another figure)", "e: a flag indicating the occurrence of an error during the process", and "f: other data".

Next, in the process of generating identification data by applying the hash function to the data indicating the sides of the figure element and adding the identification data to the data indicating the sides of the figure element, first, the hash function is applied to a side-direction value (indicated by the relative coordinates of the end-point coordinates with respect to the start-point coordinates) computed from the figure-element side data 174 and to the additional information data 175 to generate identification data 176. The identification data 176 is data including a symbol, a number, etc. The hash function is a function which converts given original text, original numbers, or original coordinates into a character or number string having a fixed length in order to acquire a key allowing for high-speed search using the hash method. Then, the identification data 176 is assigned to the figure-element side data 174 and the additional information 175 to produce the figure-element side data 174 and the additional information 175 added with the identification data 176. The figure-element side data 174 and the additional information 175 that indicate different content are assigned different identification data 176. If the identical identification data is found, input data sets of the hash function are compared, and different input content is assigned different identification data. It is to be understood that the identical identification data 176 is assigned to the figure-element side data 174 and the additional information 175 that indicate the same content.

Figure 14:
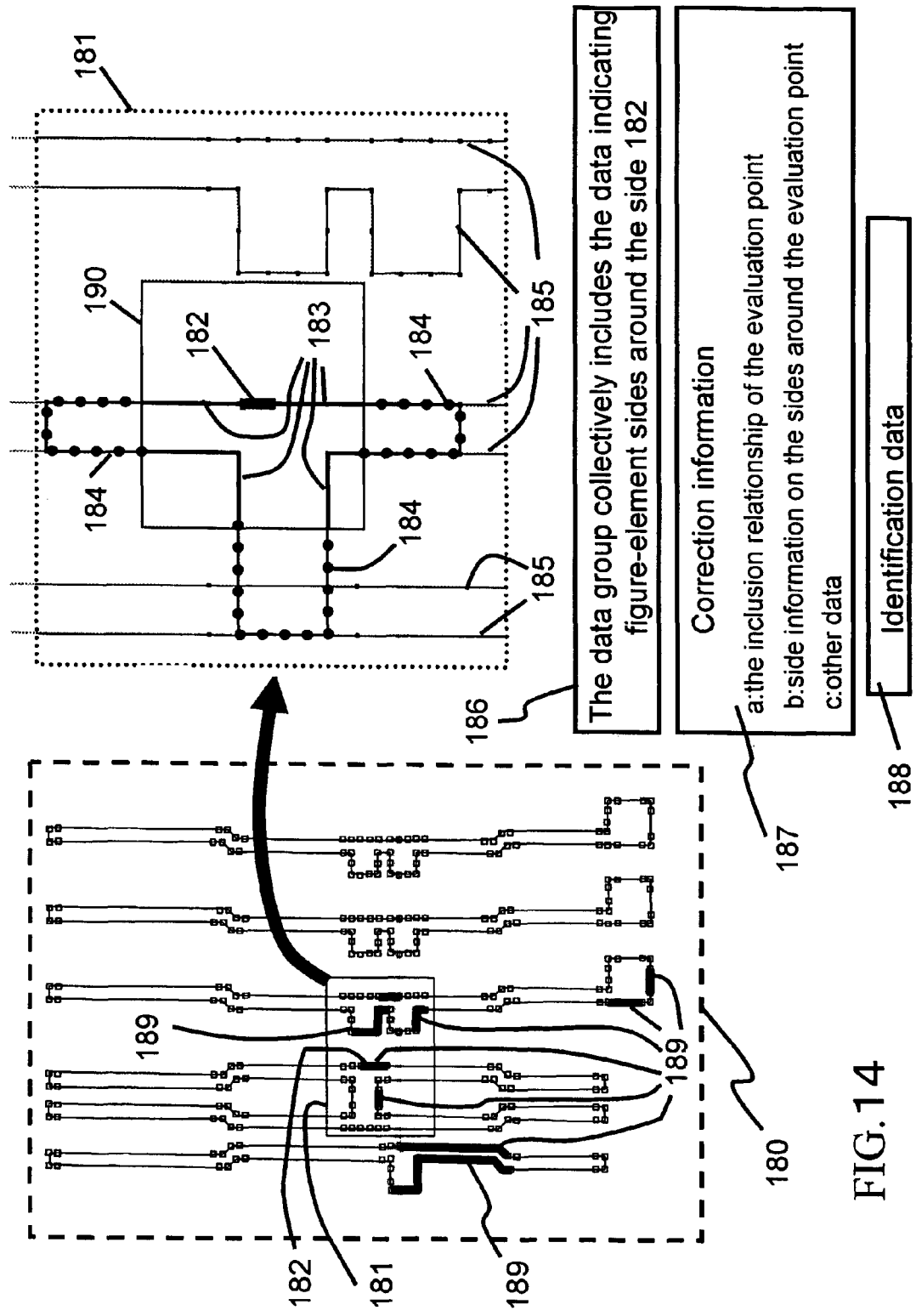
FIG. 14 is an illustration showing a figure-element side group setting step and a step of assigning identification data to a data group indicating a group of figure-element sides in the flowchart shown in FIG. 12.

FIG. 14 is an illustration showing the process of setting a group of figure-element sides and assigning identification data to a data group indicating the group of figure-element sides (steps 159 and 160 in the flowchart shown in FIG. 12).

The processing of step 159 in the flowchart shown in FIG. 12 includes a step of setting a figure region based on a figure-element side to be corrected, and a step of extracting a figure-element side group overlapping or adjacent to the figure region. In the step of setting a figure region based on a figure-element side to be corrected, a region affected by the optical proximity effect is set as a figure region. In the step of extracting a figure-element side group overlapping or adjacent to the figure region, a group of figure-element sides that overlaps or is adjacent to the figure region is identified based on the identification data assigned to the figure-element side data, and a data group indicating the group of figure-element sides is extracted.

In the processing of step 160 in the flowchart shown in FIG. 12, correction information data is assigned to the data group indicating the group of figure-element sides, and the hash function is applied to the correction information data and the data group indicating the group of figure-element sides to generate identification data. The identification data is then assigned to the data group indicating the group of figure-element sides. In the processing of step 160, by retrieving the identification data, identification data distinguished from other identification data, i.e., unique identification data, is identified. The hash function includes, for example, a function which determines the sum of X coordinates of the data group indicating the group of figure-element sides.

Referring to FIG. 14, in the processing of step 159, first, a figure-element side 182 to be corrected is selected from a group 180 of figure-element sides. One evaluation point (reference point) is defined on the side 182. Then, as indicated in an enlarged portion 181, a region in which the figure-element side 182 to be corrected is affected by the optical proximity effect is set as a figure region 190. Then, a group of figure-element sides overlapping or adjacent to the figure region 190 is extracted from other figure-elements sides 185. Then, a data group 186 indicating a group 183 of figure-element sides with respect to the figure-element side 182 to be corrected is created. The data group 186 must define a closed figure when data indicating the figure-element side 182 to be corrected is corrected taking the optical proximity effect into consideration. Thus, the data group 186 includes data indicating imaginary sides 184 indicated in the enlarged portion 181. The indicating imaginary sides 184 are necessary for computation to estimate correction that is performed on the figure-element side 182 to be corrected. The data group 186 collectively includes the data (174, 175, and 176 in FIG. 13C) indicating figure-element sides around the side 182, including the imaginary sides 184 and the side 182. In this information, the vertex coordinates 174 shown in FIG. 13C have been converted into the relative coordinates with respect to the evaluation point (reference point).

In the processing of step 160, first, correction information 187 is generated for the data group 186 indicating the group 183 of figure-element sides with respect to the figure-element side 182 to be corrected. The correction information 187 includes "a: the inclusion relationship of the evaluation point", "b: side information on the sides around the evaluation point", and "c: other information". Then, the hash function is applied to data indicating the correction information 187 and the data group 186 to generate identification data 188, and the identification data 188 is assigned to the data group 186. All sides to be corrected within the group 180 shown in FIG. 14 also are subjected to this process, and are assigned the identification data 188.

Then, sides having the identification data 188 are compared and sorted to classify the identification data 188. It ensures that sides having different identification data 188 have different information (187 and 186); however, sides having the identical identification data 188 do not necessarily have the identical information (187 and 186). The sides to be corrected having the identical identification data 188 are compared in detailed information (187 and 186). If the sides have different information (187 and 186), different identification data 188 are assigned to these sides.

Thus, the sides having the identical identification data 188 have the same amount of correction. One of the sides having the identical identification data 188 is selected as a representative, and the representative side is set as a side 189 of a figure element for which estimation of the amount of correction is necessary. The representative side 189 may be arbitrarily selected, and either representative side results in the same estimated amount of correction. Preferably, for example, the side having the start point having the minimum values in the absolute coordinate system is set as the representative.

In the foregoing description, classification of the unique identification data 188 is performed by searching using simple comparison and sorting. The classification of the unique identification data 188 may also be performed while considering rotation of figure-element sides, upside-down sides of figure elements, removal of a portion of a side group for a figure set as sides of figure elements which may not affect the correction, and further division of the figure-element sides.

Figure 15:
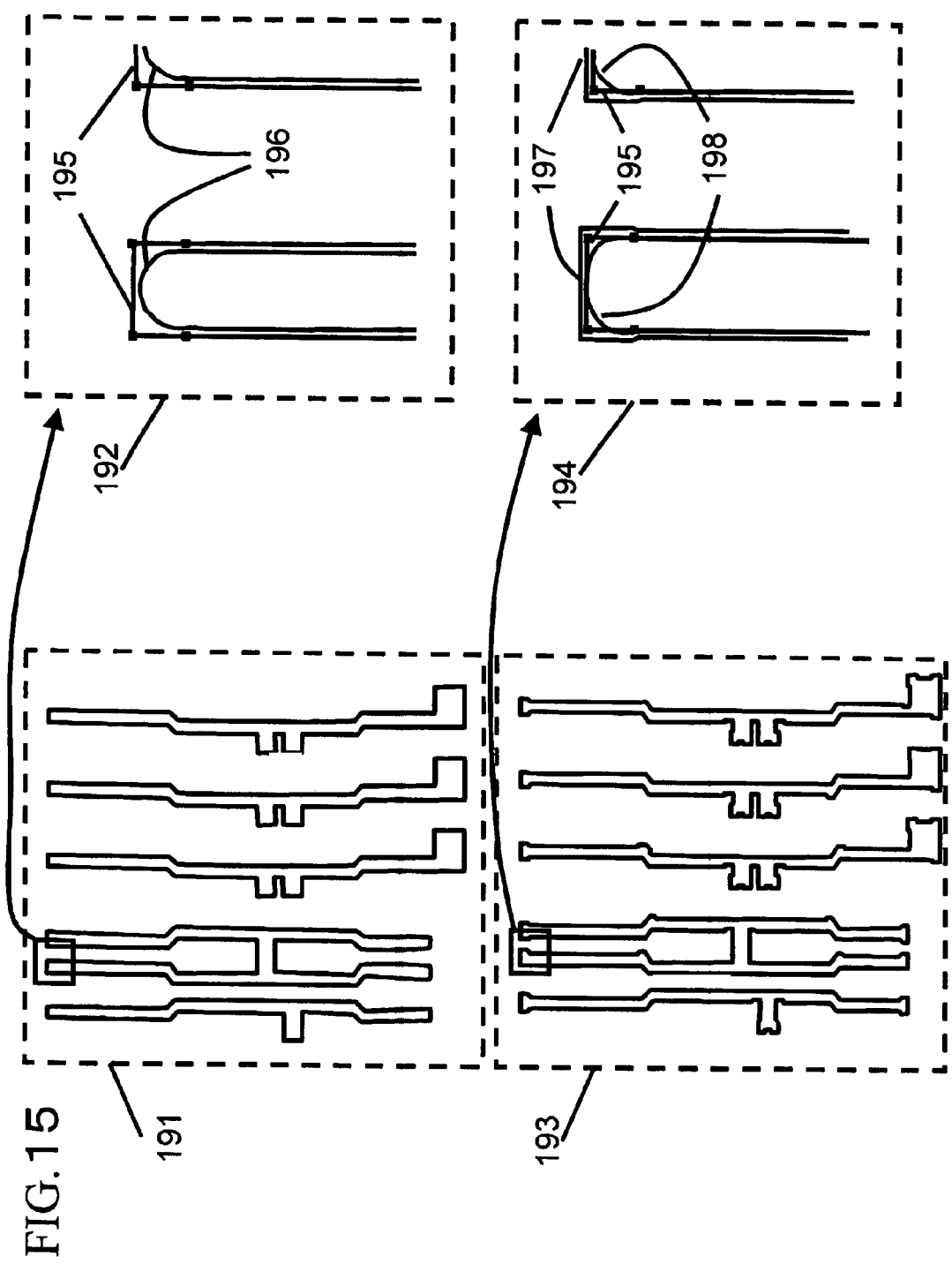
FIG. 15 is an illustration showing an optical proximity effect estimating step and a corrected-figure generating step in the flowchart shown in FIG. 12.

FIG. 15 is an illustration showing the process of estimating the optical proximity effect and generating a corrected figure (steps 161 and 162 in the flowchart shown in FIG. 12).

In step 161, the influence of the proximity effect on the shape of a projected image generated by applying light to a figure element is estimated by computer-based simulation. In step 162, a corrected figure element in which the figure element is corrected for the shape so that the shape of the projected image becomes similar to the shape of the figure element is generated.

Referring to FIG. 15, in the processing of step 161, first, a projected image of a figure element group 191 is determined by computer-based simulation. That is, as indicated in an enlarged portion 192 showing a portion of the figure element group 191, a projected image 196 is produced by applying light to a portion of a figure element. Then, a side 195 of the figure element and a side portion of the projected image 196 are compared in shape to estimate the influence of the optical proximity effect.

Then, the processing of step 162 is performed by the following procedure: first, as indicated in an enlarged portion 194 showing a portion of a corrected figure element 193, a corrected-figure-element side 197 in which a side portion of a projected image 198 of the portion of the corrected figure element 193 is similar to the side 195 of the figure element is generated, taking an influence of the optical proximity effect into consideration. The processing of step 162 is performed only on the side (the side 189 shown in FIG. 14) of the figure element for which it is determined in step 159 that estimation of the correction is necessary. The distance between the side 195 of the figure element and the corrected-figure-element side 197 corresponds to the amount of correction. The amount of correction is determined for each side, and is then stored as the amount of correction (included in "c: other information" in the correction information 187 shown in FIG. 14) corresponding to the identification data (188 in FIG. 14).

Figure 16:
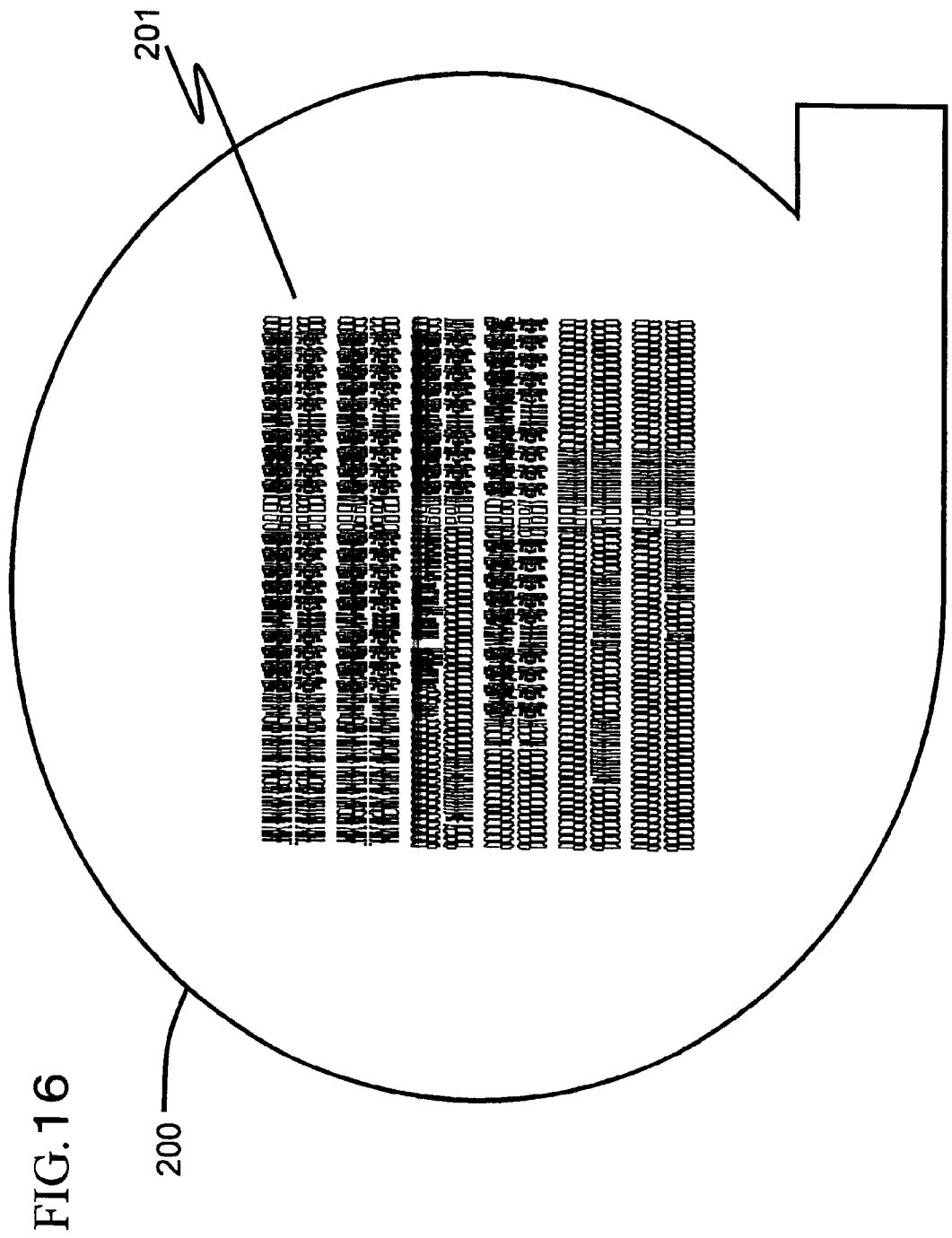
FIG. 16 is an illustration of figure data that is configured by distributing a corrected-figure-element side.

FIG. 16 shows figure data 200 that is created by performing the processing of step 164 in the flowchart shown in FIG. 12. The figure data 200 includes a set of corrected figure elements 201.

The processing of step 164 is performed by the following procedure: first, since the amount of correction corresponding to all unique identification data 188 has been determined, the amount of correction for figure-element sides having the identical identification data 188 is determined accordingly. After the amount of correction for all figure-element sides is determined, the figure is deformed according to the amount of correction for each of the sides. If it is determined in step 163 in the flowchart shown in FIG. 12 that the amount of correction is not sufficient, the amount of additional correction is determined. In this case, the deformed figure-element sides are returned to the initial state, and, instead, the amount of correction for a figure-element side ("b: the amount of correction for the side" in the additional information 175 shown in FIG. 13C) is stored. The subsequent estimation of the amount of correction is performed considering "b: the amount of correction for the side" in the additional information 175 shown in FIG. 13C. Therefore, the set of correction figure elements 201 is produced. In this way, data indicating all figure-element sides is deformed using the amount of correction based on the identification data, thereby converting the design data constituted by figure-element side data into figure data to be actually used to form a metal thin-film pattern on a photomask.

Association based on the identification data shown in FIG. 14 means that the same amount of correction is used for sides having the identical identification data (188 in FIG. 14).

The processing of step 163 in the flowchart shown in FIG. 12 is a similar step to the inspection step (step 23 in the flowchart shown in FIG. 2) described with reference to FIG. 8. Specifically, in step 163, evaluation points of a figure element are compared with evaluation points of a projected image of the figure element to inspect deformation of the projected image due to the optical proximity effect in order to determine the conformity in shape between the projected image and the figure element.

The method for manufacturing a reticle according to the second embodiment includes the steps shown in FIG. 1, i.e., the steps of creating design data of a metal thin-film pattern on a reticle, checking the design data, generating figure data for forming a corrected metal thin-film pattern on the reticle by optical proximity effect correction, checking the optical proximity effect, forming an exposure pattern, checking the line width of the exposure pattern, i.e., the resist pattern, and forming a metal thin-film pattern by etching. The step of generating figure data for forming a metal thin-film pattern by optical proximity effect correction includes the steps shown in FIG. 12, i.e., the step of performing initial processing on design data, extracting a group of figure-element sides, assigning identification data, setting a figure element group, assigning identification data, estimating the optical proximity effect, generating a corrected figure, performing inspection, and configuring figure data by distributing a corrected figure element.

According to the method for manufacturing the reticle according to the second embodiment, therefore, the time required for manufacturing the reticle can be reduced. This is because the time for generating figure data for a metal thin-film pattern on the reticle is reduced.

Optical proximity effect correction was performed on design data included in a region of about 264 µm×210 µm on a reticle according to the flowchart shown in FIG. 12. As a result, the number of figure-element sides for which it was determined that estimation of the correction was necessary, as described with reference to FIG. 14, was 1,089 out of 129,582 figure-element sides. It took ten seconds to identify the figure-element sides for which it was determined that estimation of the correction was necessary from classified identification data by searching and sorting. It further took ten seconds to compute a corrected-figure-element side with respect to the figure-element sides. On the other hand, it took 20 minutes, or 1,200 seconds, to compute a corrected-figure-element side with respect to all figure-element sides without identifying the figure-element sides for which it was determined that estimation of the correction was necessary. Therefore, according to flowchart shown in FIG. 12, the figure data can be produced 60 times faster than normal.

According to the method for manufacturing the reticle according to the second embodiment, furthermore, the time for manufacturing a reticle can be reduced even if a smaller grid is used as the grid of the figure data. According to the method for manufacturing a reticle according to the second embodiment, therefore, a reticle having a high-accuracy pattern can also be manufactured.

Third Embodiment

A method for manufacturing a semiconductor device according to a third embodiment of the present invention using the reticle manufactured in the first or second embodiment will be described with reference to FIG. 17.

Figure 17:
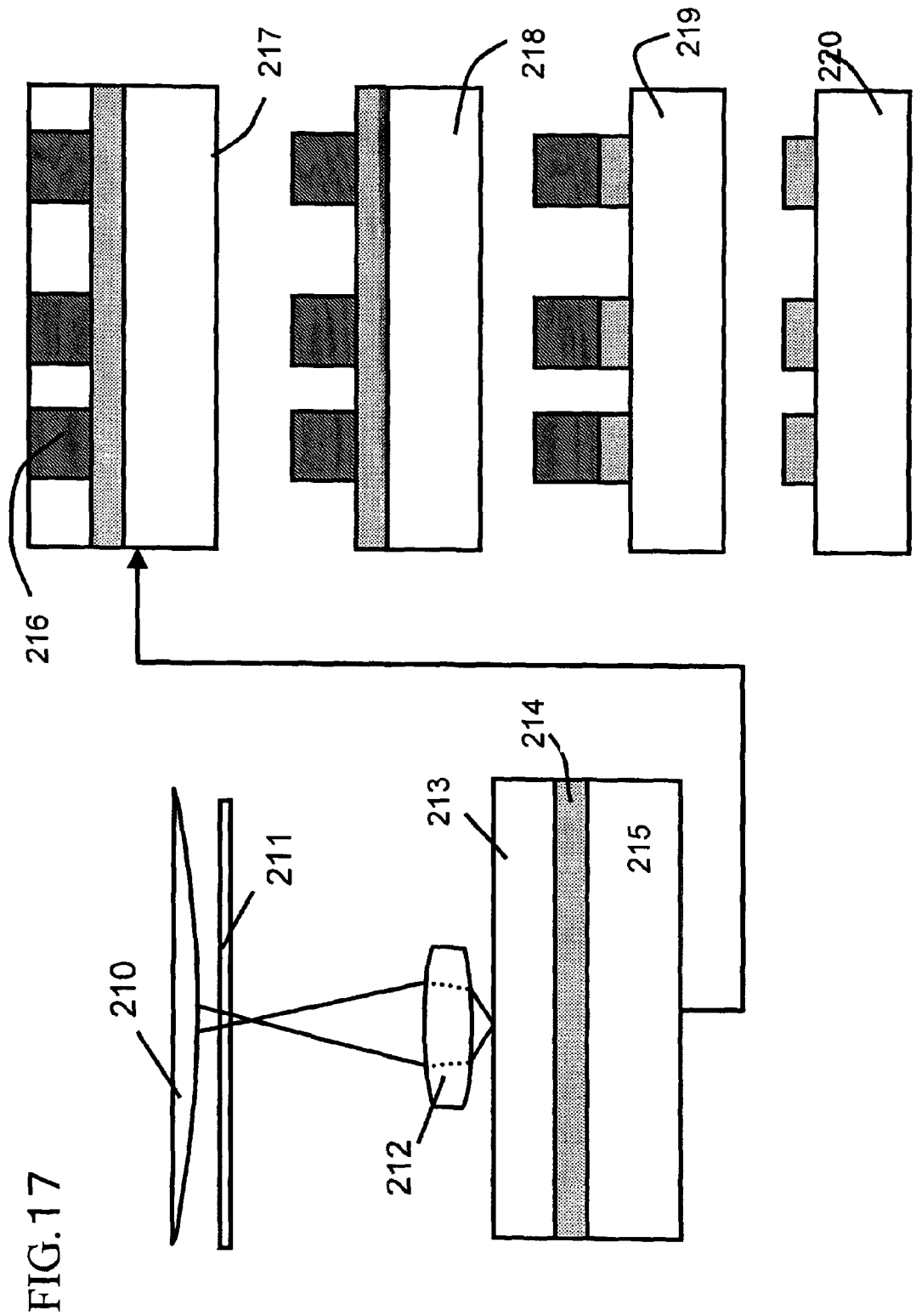
FIG. 17 is an illustration showing a process for forming a resist pattern on a semiconductor substrate using the reticle manufactured in the first or second embodiment, and a process for forming a metal wiring pattern on the semiconductor substrate by etching.

FIG. 17 is an illustration showing a process for forming a resist pattern on a semiconductor substrate using the reticle manufactured in the first or second embodiment, and a process for forming a metal wiring pattern on the semiconductor substrate by etching.

Referring to FIG. 17, the process for forming a resist pattern on a semiconductor substrate is performed by the following procedure: first, a metal layer 214 is deposited on a semiconductor substrate 215, and is coated with a resist 213. Then, a light 210 is applied to a reticle 211, and light transmitting the reticle 211 is focused by a projector lens 212 to expose the resist 213 to light. Layers 217 with the resist 213 exposed to light are shown in cross-section. Then, a resist 216 that is cured by exposure is left and the unnecessary resist 213 is removed to form a resist pattern. Layers 218 with the unnecessary resist being removed are shown in cross-section.

Then, the process for forming a metal wiring pattern on the semiconductor substrate by etching is performed by the following procedure: first, a pattern on the metal layer 214 is formed by anisotropic etching using the resist pattern as a mask. Layers 219 after etching are shown in cross-section. Then, the resist pattern is removed, thereby obtaining layers 220 in cross-section with the resist pattern being removed.

According to the method for manufacturing a semiconductor device according to the third embodiment, therefore, the reticle manufactured in the first embodiment or the reticle manufactured in the second embodiment is used to form a metal layer pattern, thus allowing for high-accuracy metal patterning.

We claim:

1. A manufacturing method for a photomask based on design data indicating plurality of first figure elements comprising the steps of;
    extracting first data from the design data indicating a first figure element;
    forming a first figure element group including the first figure element and first figure elements affecting the first figure element due to the optical proximity effect;
    assigning identical identification data to a identical first data group indicating the first figure element group;
    estimating a influence of an optical proximity effect on the first figure element group;
    generating second data indicating a second figure element for compensating the influence of the optical proximity effect on the first figure element group;
    configuring figure data indicating plurality of second figure elements by assigning identical second data to the identical first data being included in the identical first data group with the identical identification data; and
    forming photomask patterns on the photomask using the figure data.

2. A manufacturing method for a photomask as claimed in claim 1,
    wherein the first identification data have key data being made from coordinate of the vertex of the first figure element by hash function;
    wherein the step of recognizing the first figure element group in the region by the first identification data comprises the step of;
    recognizing the first figure group in the region by the key data;
    wherein the step of configuring a first data group indicating the first figure element group in the region;
    configuring a first data group indicating the first figure element group from first data indicating the first figure elements in the region.

3. A manufacturing method for a photomask as claimed in claim 1, further comprising the steps of;
    removing unnecessary data from the design data;
    adding vertex data of the first figure element to the first data indicating the first figure element;
    adding data indicating evaluation points to the first data indicating the first figure element; and
    evaluating compensation for the influence of the optical proximity effect in the data indicating evaluation points in the second data indicating the second figure element.

* * * * *